(12) United States Patent
Taniguchi et al.

(10) Patent No.: US 6,927,839 B2
(45) Date of Patent: Aug. 9, 2005

(54) METHOD AND APPARATUS FOR FORMING PATTERN ON THIN SUBSTRATE OR THE LIKE

(75) Inventors: Yukio Taniguchi, Yokohama (JP);
Hirotaka Yamaguchi, Yokohama (JP);
Susumu Tsujikawa, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

(21) Appl. No.: 10/685,494

(22) Filed: Oct. 16, 2003

(65) Prior Publication Data

US 2004/0080734 A1 Apr. 29, 2004

(30) Foreign Application Priority Data

Oct. 17, 2002 (JP) .................................... 2002-303364

(51) Int. Cl.[7] .......................... G03B 27/58; G03B 27/62
(52) U.S. Cl. ........................................ 355/72; 355/75
(58) Field of Search .............................. 355/72–76, 53; 378/34, 35; 310/10, 12

(56) References Cited

U.S. PATENT DOCUMENTS

| | | | | |
|---|---|---|---|---|
| 4,391,511 A | * | 7/1983 | Akiyama et al. | 355/40 |
| 4,737,824 A | * | 4/1988 | Sakai et al. | 355/53 |
| 5,724,121 A | * | 3/1998 | McKinley et al. | 355/53 |
| 6,529,266 B1 | * | 3/2003 | Sandstrom | 355/72 |

FOREIGN PATENT DOCUMENTS

| JP | 63-260129 | 10/1988 |
|---|---|---|
| JP | 2001-36088 | 2/2001 |

OTHER PUBLICATIONS

"Flat–Panel Display 2002", Separate vol. of Nikkei Micro Device, pp. 158–161.

* cited by examiner

Primary Examiner—Henry Hung Nguyen
(74) Attorney, Agent, or Firm—Oblon, Spivak, McClelland, Maier & Neustadt, P.C.

(57) ABSTRACT

A substrate processing apparatus of the present invention has a retaining base which retains a substrate, a device detecting undulation or thickness unevenness, and a control device which operates the detecting device. The substrate is deformed in a range of a field to be processed, by locally displacing the retaining base on the basis of the detected undulation or thickness unevenness of the substrate. Blurring of an image formed on the substrate can be thereby prevented.

13 Claims, 13 Drawing Sheets

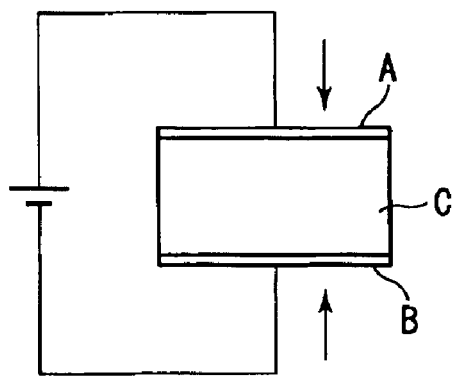
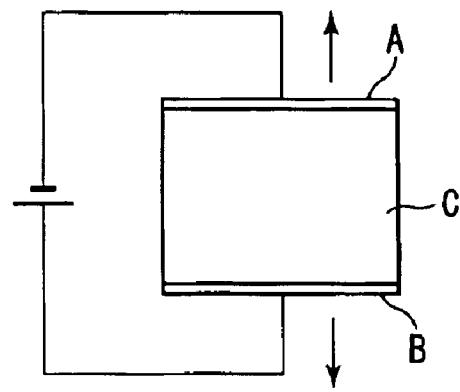
FIG. 3A　　　　　　FIG. 3B
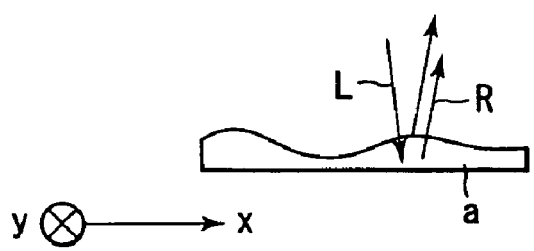
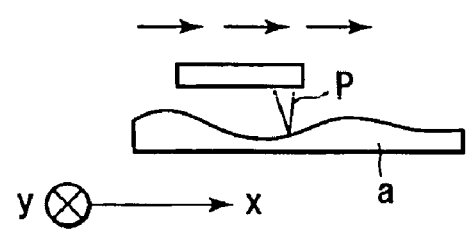
FIG. 4A　　　　　　FIG. 4B
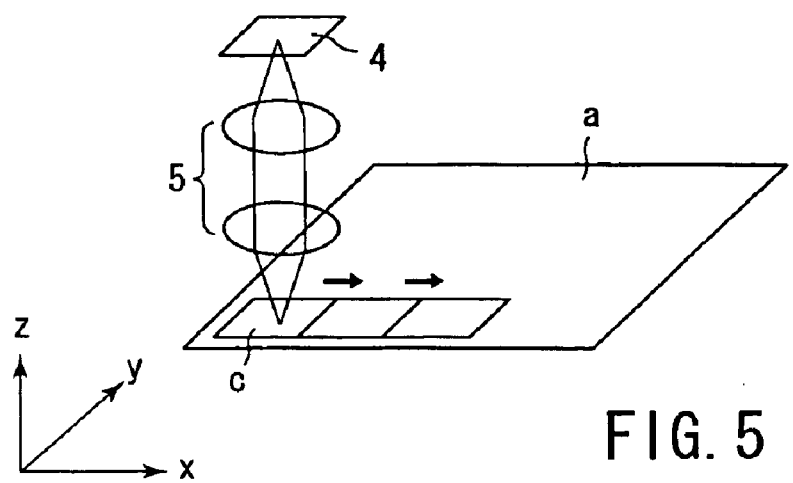
FIG. 5

METHOD AND APPARATUS FOR FORMING PATTERN ON THIN SUBSTRATE OR THE LIKE

CROSS-REFERENCE TO RELATED APPLICATIONS

This application is based upon and claims the benefit of priority from the prior Japanese Patent Application No. 2002-303364, filed Oct. 17, 2002, the entire contents of which are incorporated herein by reference.

BACKGROUND OF THE INVENTION

1. Field of the Invention

This invention relates to an exposure device, a processor and an exposing method for a substrate particularly having large unevenness in thickness as represented by a glass substrate used for a liquid crystal display or the like, a method of producing a thin film transistor, and a method of producing a display device.

2. Description of the Related Art

A glass substrate used for a semiconductor substrate, a liquid crystal display or the like is formed by patterning and stacking a plurality of materials such as semiconductor layers, insulation layers and the like. A technique of lithography is employed for the patterning.

According to the lithography, a photoresist is applied to a material to be processed to form a photoresist layer, an exposing pattern is formed on the resist layer (surface), the resist layer is developed, processing such as etching, deposition or the like is selectively performed on a portion obtained (left) by removing the resist layer of the non-developed portion, and a circuit, a transistor and the like are formed. A typical scheme of exposure is projection exposure such as lens projection exposure, mirror projection exposure, or the like. According to this exposure scheme, an image (exposure pattern) of an original plate (mask) is projected to the surface of the processed article to which the resist layer is applied, to form an image corresponding to the exposure pattern on the resist layer (by forming an image of the exposure pattern).

In the projection exposure, a focal distance of a projector, i.e., an image-formed surface formed by the projection exposure, is required to be equal to a distance from the projector to the exposed surface (resist surface).

In some cases, however, the resist layer surface, i.e. the exposed surface is microscopically wavy. The waviness on the resist surface layer is caused due to unevenness in thickness of the substrate on which the resist layer is formed, binding of the substrate, flatness of a stage on which the substrate is placed, and the like.

An amount of variation in the waviness on the resist layer surface needs to fall within a range in which a depth of focus (DOF) of an image-forming optical system (incorporated in the projector) can be maintained at a predetermined level. Needless to say, if the distance between the exposed surface and the projector is out of the range of the DOF, a light intensity distribution (air image) of an image-forming pattern is deformed and an expected resist pattern (in a flat or cross-sectional shape) cannot be obtained. In other words, portion A that is out of the range of the DOF is not resolved as illustrated in FIG. 21.

In general, a relationship between the resolution of the image on the resist layer and the DOF, in the exposure, is defined by the following formula:

$$DOF = k \cdot R^2 / \lambda$$

where $\lambda$ represents a wavelength of a light source, R represents a line width (resolution), and k represents a factor of proportionality (value of about 1 according to the process).

At the exposing time, the exposed surface of the resist layer surface needs to fall within the range of the DOF. In other words, the exposed surface needs to be located at a position satisfying the following formula (1):

$$DOF > \text{"unevenness in thickness of substrate"} + \quad (1)$$

"waviness on surface of stage (substrate retaining portion)" +

"accuracy of focusing (permissible value of deviation of the focal position of the image-forming optical system in the projector and the focal distance which is inherent to the image-forming optical system)" +

"waviness caused by a processed layer" +

"influence from aberration of the image-forming optical system" +

"degree of freedom of the process"

If a thin-substrate a is placed on a stage S as illustrated in FIG. 19, the magnitude of waviness on the resist layer surface, i.e. the exposed surface, of the substrate a, is equal to a sum of "(the amount of unevenness in thickness of the substrate)+(the magnitude of waviness on the stage surface)". They are entirely called "undulation T".

Jpn. Pat. Appln. KOKAI Publication No. 2001-36088 discloses that such "undulation T" is cyclic, and that the "undulation T" may cause a problem when the microscopic pattern is exposed.

However, a large-scale exposure device, for example, an exposure device capable of forming a predetermined pattern on a glass substrate used for a large-scale liquid crystal display device (having a size of 20 (inch)×25 (inch), or a diagonal line longer than 32 inches) (or a glass substrate which is set on the exposure device) can hardly satisfy the conditions of formula (1) for the following reasons a) and b):

a) Recently, a high-definition image has been required to display the digital information. Thus, as high resolution is required (i.e., as the line width R is made smaller), the band in which the DOF is permissible becomes narrower.

b) Particularly, in a case of a liquid crystal display, a silicon wafer having good flatness (as used as a substrate of a semiconductor device) is not, but a glass substrate having a great unevenness in thickness (as compared with the flatness of the silicon wafer) is used. In the manufacturing process, as the glass substrate is selected to be so large that a plurality of glass substrates for single display devices can be formed thereon, the unevenness in thickness of the glass substrate is apparently increased on the entire area of the glass substrate set on the exposure device.

As a result, if the line width is to be smaller and the resolution is to be higher, the maximum value and the minimum value of the unevenness in thickness of the glass substrate go out of the DOF.

It is assumed here that, for example, if a pattern having a (minimum) line width R=1.0 μm is exposed as an exposure field which is 100 mm square, on a substrate for liquid crystal display having a size of 550×650 mm, the following values are employed:

$\lambda=0.365$ μm (utilized wavelength), $k=1.0$

At this time, $DOF=k\cdot R^2/\lambda=2.7$ μm

The exposure field needs to be sufficiently larger than the substrate size in order to reduce a time required for exposure of the overall substrate. In general, the exposure field which is about 100 mm square is employed, for a substrate for liquid crystal display which is larger than a size of about 550×650 mm.

The unevenness in thickness of the glass substrate for liquid crystal display is, in general, about 10 μm (Peak to Peak) to a width of 100 mm.

Therefore, the DOF is smaller than the unevenness in thickness of the substrate, and the formula (1) will not be satisfied even if the other terms are "0". In other words, the image of the exposed mask (i.e., the light intensity distribution on the exposed surface) is blurred at a position where the image-formed surface and the exposed surface (i.e., the resist surface) greatly separate from each other due to the unevenness in thickness. This matter is also handled as a problem in Jpn. Pat. Appln. KOKAI Publication No. 2001-36088.

It has already been known that the unevenness in thickness of the glass substrate for liquid crystal display is substantially one-dimensional as illustrated in FIG. 23. In other words, the thickness is uneven in a direction x while it is even in a direction y in FIG. 23. As a typical producing method of the substrate glass, there are a fusion method and a float method. The conditions of the unevenness in thickness are derived from characteristics of the producing methods.

On the other hand, as the exposure scheme employed to produce a thin-film transistor (TFT) used for the liquid crystal display and the like, there are mainly "step-and-repeat" scheme and "step-and-scan" scheme. In the exposure device in either of the schemes, however, there is the only stage retaining the substrate for exposure, but necessity of a mechanism of flattening the wavy surface or a stage for measurement of the waviness is not considered.

In the step-and-repeat scheme, the unevenness on the exposed substrate surface is measured by an autofocus system and an optimum surface is determined by tilting or up-and-down movement, before performing static exposure of each shot on the substrate stage for exposure.

In a case where a mechanism of flattening the wavy surface is added to the substrate stage to perform the exposure of the step-and-repeat scheme, the waviness on the surface of the substrate placed on the substrate stage is measured before performing sequential operations of static exposure (or merely exposure operations). For this reason, a time passing until the end of exposure is longer and throughput is deteriorated.

In the step-and-scan scheme, c) the waviness on the surface of the substrate placed on the substrate stage is measured before scanning exposure, and d) simultaneously with the start of the scanning exposure, the scanning exposure is performed while determining the optimum exposed surface by tilting and/or up-and-down movement, on the basis of the measurement data.

At this time, the scanning exposure may be performed simultaneously with addition of focus control. Thus, in the step-and-scan scheme, the time to measure the waviness on the substrate surface to be exposed is included in the exposure time, the time passing until the end of exposure becomes longer, and the throughput is deteriorated similarly to the step-and-repeat scheme.

Incidentally, Jpn. Pat. Appln. KOKAI Publication No. 63-260129 discloses a method of measuring the waviness on the substrate surface and flattening the waviness by, for example, a plurality of two-dimensionally aligned piezoelectric elements, before conveying the substrate to be exposed onto the exposure stage. However, precise control means partially adjusting the height by two-dimensionally aligned piezoelectric elements are needed.

BRIEF SUMMARY OF THE INVENTION

A problem to be solved by the present invention is that the mask image is blurred and a desired pattern cannot be formed for the resist, at a position where the image-formed surface and the exposed surface largely separate due to the unevenness in thickness of the glass substrate used for a large-scale liquid crystal display device.

Another problem to be solved is that in a case where the exposure is performed by adding a flattening mechanism, a time to be required before the end of exposure becomes longer and the throughput is deteriorated.

As still another problem, the flattening mechanism is a large-scale device and the manufacturing costs of the exposure device are further increased.

According to an aspect of the present invention, there is provided an exposure device exposing an exposure pattern to a substrate, comprising detecting means for detecting undulation or thickness unevenness on a surface of a substrate, retaining means having support mechanisms elongated in a direction orthogonal to a direction of the undulation or thickness unevenness detected by the detecting means, for supporting the substrate, the support mechanisms being arranged in the direction of the undulation or thickness unevenness, support mechanism adsorbing plates capable of being independently displaced in a direction of displacement orthogonal to the surface of the substrate, and a plurality of adsorbing means provided on the retaining means of the support mechanisms along a length direction of the support mechanisms, for adsorbing and retaining the substrate.

According to another aspect of the present invention, there is provided a device for processing a member on a stage, comprising detecting means for detecting undulation or thickness unevenness on a surface of a member, retaining means having adsorbing plates elongated in a direction orthogonal to a direction of the undulation or thickness unevenness on the surface of the member, the adsorbing plates being aligned in the direction of the undulation or thickness unevenness, the adsorbing plates capable of being independently displaced in a direction of displacement orthogonal to the surface of the member, and adsorbing means provided on the respective adsorbing plates, for adsorbing the member.

According to still another aspect of the present invention, there is provided a method of exposing an exposure pattern to a substrate provided at a predetermined position of retaining means in which a plurality of adsorbing plates are aligned, the method comprising positioning and arranging the substrate on the retaining means, and exposing the pattern such that a direction orthogonal to a direction of undulation or thickness unevenness on a surface of the substrate corresponds to a direction of longitudinal edges of the adsorbing plates.

According to further another aspect of the present invention, there is provided a method of exposing an exposure pattern to a substrate provided at a predetermined position of retaining means in which a plurality of adsorbing plates are aligned, the method comprising adsorbing the substrate on surface of the adsorbing plates, detecting undulation or thickness unevenness on a surface of the substrate, and adjusting the adsorbing plates elongated in a direction orthogonal to a direction of the undulation or thickness unevenness, in a direction orthogonal to the surface of the substrate, in accordance with the detected undulation or thickness unevenness.

According to still further another aspect of the present invention, there is provided a method for producing a thin film transistor by exposing a MOS-TFT pattern to a substrate provided at a predetermined position of retaining means at which a plurality of adsorbing plates are aligned, the method comprising adsorbing the substrate on surface of the adsorbing plates, detecting undulation or thickness unevenness on a surface of the substrate, adjusting the adsorbing plates elongated in a direction orthogonal to a direction of the undulation or thickness unevenness, in a direction orthogonal to the surface of the substrate, in accordance with the detected undulation or thickness unevenness, and exposing a predetermined exposure pattern to the substrate on which a semiconductor thin film is preliminarily formed, by an exposure section, under a condition that the adsorbing plates are adjusted in accordance with the detected undulation or thickness unevenness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are schematic views illustrating an operation of a piezoelectric element built in the undulation correcting device illustrated in FIG. 1;

FIGS. 4A and 4B are schematic views illustrating a principle of detecting the undulation of a substrate by the undulation correcting device illustrated in FIG. 1;

FIG. 5 is a schematic view illustrating an example of exposing a pattern to the substrate, according to an embodiment of the present invention;

DETAILED DESCRIPTION OF THE INVENTION

Embodiments of the present invention will be described below with reference to the attached drawings.

Figure 1:
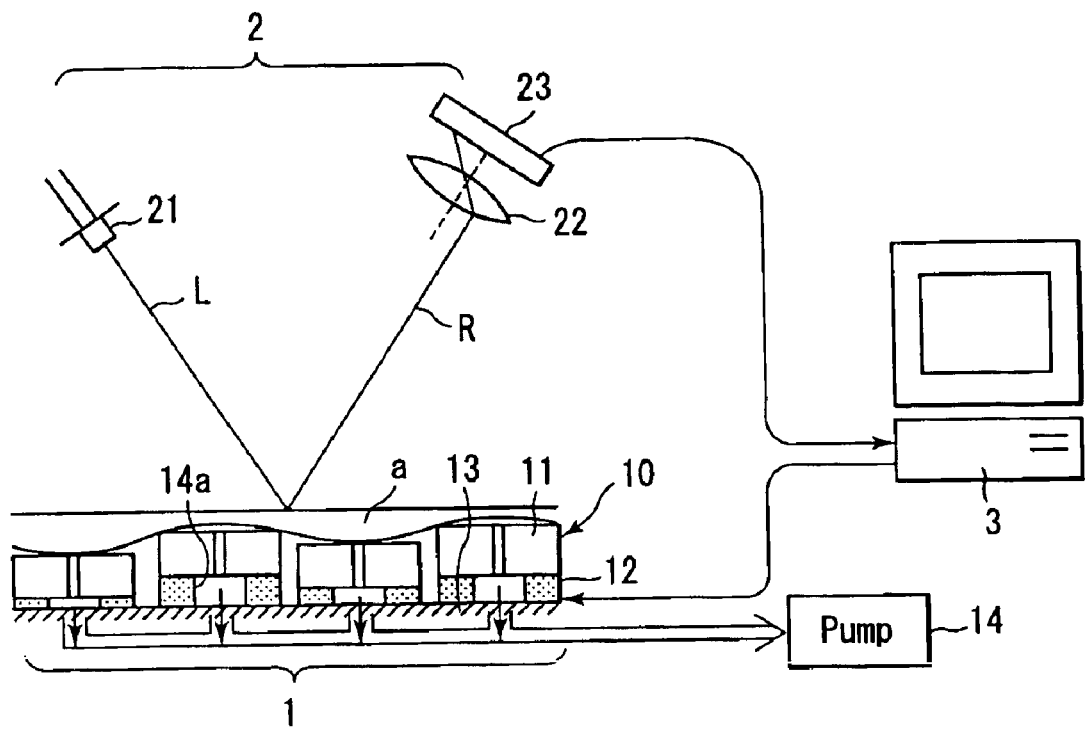
FIG. 1 is a schematic view illustrating an example of a device correcting undulation of an influence on an exposed surface, according to an embodiment of the present invention.

FIG. 1 is a view for explanation of a structure of a device correcting undulation or thickness unevenness of an influence on an exposed surface, according to an embodiment of the present invention.

An undulation or thickness unevenness correcting device which corrects undulation and thickness unevenness on a predetermined region i.e., a surface to be exposed, of an object a or a plate-like member such as a glass substrate or a silicon wafer, includes a retaining means (substrate deforming mechanism) 1 which retains a substrate a, an undulation or thickness unevenness correcting means 2 which senses the undulation or thickness unevenness of the substrate a placed on the retaining means 1, and a control device 3 which controls operations of the correcting means 2. For example, a personal computer or the like is available as the control device 3.

The retaining means 1 is configured to comprise deforming elements 10 having both a plurality of adsorbing plates (adsorbing means) 11 that adsorb the substrate a, and a plurality of substrate deforming elements 12 that deform the substrate a adsorbed by the adsorbing plates 11 and include, for example, piezoelectric elements (deforming means), and a stage 13 which supports the deforming elements 10.

Figure 2:
FIG. 2 is a schematic view illustrating an example of an adsorbing mechanism which can be built in the undulation correcting device illustrated in FIG. 1.

The adsorbing plate 11 is obtained by integrally forming an elastic member of silicon rubber or the like on a surface of a metal plate of a material having suitable rigidity, flexibility and elasticity, for example, aluminum. A plurality of vacuum evaporation openings or tubes b are provided along a length direction of the adsorbing plate 11, substantially at a center of the length direction, as illustrated in FIG. 2. Each of the vacuum evaporation openings or tubes b is connected to a vacuum pump 14 through a flow path (i.e., a conduit not illustrated) connected to each of the plurality of vacuum evaporation openings or tubes b, i.e., a pipe 14a. The piezoelectric elements 12 are fixed on both right and left sides of the vacuum evaporation opening or tube b at the bottom of each of the adsorbing plates 11. A plurality of adsorbing plates 11 having substantially the same length as the width of the substrate a are aligned parallel, with a constant interval, along a direction in which the thickness unevenness of the substrate a is greater. Preferably, the adsorbing plates 11 are aligned at a pitch smaller than a half of a fundamental cycle in the thickness unevenness of the substrate a.

When the exposed surface of the substrate a is level, the retaining means 1 can deform the substrate a by moving the deforming elements 10 independently in a vertical direction, or by inclining them simultaneously with the vertical movement. In other words, the substrate a is deformed by deforming the retaining means 1 on the basis of the undulation or thickness unevenness of the substrate a detected by an undulation or thickness unevenness detection device to be explained later, and is corrected such that the exposed surface of the substrate a is substantially equal to the image-formed surface formed by an image-forming optical system of a pattern exposure device to be explained later.

As the deforming means, a device using magnets such as solenoid coils, a device using static electricity, an actuator and the like may be employed. It is preferable to fix the substrate a by the adsorbing means such as a vacuum chuck, an electrostatic chuck and a mechanical damper as the retaining means 1. The retaining means 1 should preferably have the adsorbing means in addition to the deforming means. The electrostatic chuck is formed by, for example, integrally sintering a plurality of internal electrodes that are separated and opposite, between two upper and lower ceramics. The substrate a is fixed by utilizing an electrostatic force generated between the surface of the electrostatic chuck and the substrate placed on the surface thereof.

The piezoelectric element 12 extends or contracts in proportion to the voltage applied to the element, and is capable of high-accuracy control of the microscopic displacement. This element has characteristics of a high response speed, a great developed stress and the like, and is employed for positioning of the stage, control of a mirror for compensating optics, and the like.

Specifically, the piezoelectric element 12 is formed by sandwiching a piezoelectric ceramic C between two electrodes A and B, and the piezoelectric ceramic C can be shrunk or extended in a direction of thickness as illustrated in FIGS. 3A and 3B by changing the polarity of the voltage applied to the electrodes A and B. In addition, the amount of extension and contraction in the piezoelectric ceramic C can be minutely adjusted in accordance with the magnitude of the voltage applied to the electrodes A and B.

The undulation or thickness unevenness detecting means 2 irradiates the surface of the substrate a with a light beam from a light source, for example, a laser beam L from a semiconductor laser 21, captures a regularly reflected light beam with a lens 22, and forms an image of the light beam on a light receiving surface of a PSD (position sensitive device) 23.

The PSD 23 includes two electrodes to output signals. A position at which an image of reflected light R is formed can be specified on the basis of a ratio of output currents which are output from the respective electrodes. The surface undulation or the thickness unevenness of the substrate a is detected by obtaining the direction and the amount of displacement of the article of interest, i.e., the substrate a on the basis of the output signals which are output from the PSD 23. To enhance the accuracy of detection of the undulation or the thickness unevenness performed by the PSD 23, it is preferable to irradiate some points, for example, five points on the substrate surface with the laser beams L for measurement of height, and detect the reflected light beams R corresponding to the respective laser beams L.

Figure 23:
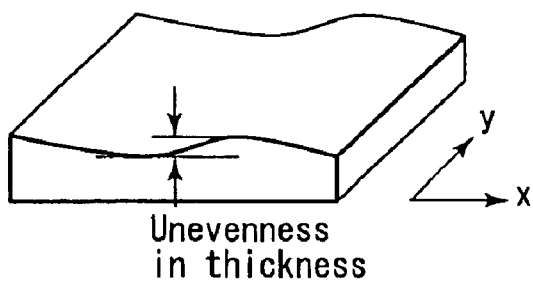
FIG. 23 is a schematic diagram explaining a (uniaxial) orientation of the fluctuation illustrated in FIG. 22.

The detection of the undulation or the thickness unevenness may be performed only one-directionally, on the premise that the thickness unevenness occurs only in one direction, for example, a longitudinal direction of the substrate a and does not occur in a lateral direction of the substrate a, for example, a direction orthogonal to the longitudinal direction. This is why it is known that the characteristic of the glass substrate such as the undulation or the thickness unevenness is substantially one-dimensional as illustrated in FIG. 23, resulting from the producing method of the glass substrate.

As the method of detecting the undulation or the thickness unevenness, other than the above method utilizing the reflected beam R, interference of light can be utilized as illustrated in FIG. 4A or a sensing pin P can be used as illustrated in FIG. 4B. In the method utilizing the interference of light and the method using the sensing pin P, detection needs to be performed before the substrate a is loaded (i.e., the substrate is moved to a predetermined position for the processing using the substrate processing device such as the exposure device or the like). In the above-described method using the interference of light, however, the detection can be performed even if the substrate a is placed on the stage 13.

The thickness unevenness of the substrate a is only detected in the method utilizing the interference of light while the undulation of the exposed surface can be detected in the method using the sensing pin P and the method utilizing the reflected light beams R.

According to the above-described measuring method scanning and irradiating the exposed surface of the substrate a with the laser beams L, receiving the reflected light beams R generated as a result of the irradiation and processing the signals, for example, the undulation of the substrate a or the direction and the amount of displacement of the thickness unevenness can be detected with accuracy in the resolving power of 0.1 μm, by using a (commercially available) laser focus displacement gauge.

In any of the detecting methods, the detecting means and/or the detecting step, the other means and/or the detecting step may be separated from each other. In addition, the processing time can be reduced by detecting undulation or thickness unevenness of a substrate area to be exposed next, simultaneously with the exposure.

A control system of the undulation or thickness unevenness detecting means 2 is connected to an input side of the control device (personal computer) 3, and a control system of the retaining means 1 is connected to an output side thereof. The output currents of the PSD 23 are A/D-converted by an A/D converter (not illustrated) and input to the control device 3, which calculates the undulation of the substrate a or the direction and the amount of displacement of the thickness unevenness.

The control device 3 calculates the direction and amount of extension and contraction in each of the piezoelectric elements 12 in accordance with the direction and the amount of displacement of the undulation or thickness unevenness, and the positions of the piezoelectric elements 12, so as to make all the points on the exposed surface of the article of interest, i.e., glass substrate a fall within the range of the DOF. Then, the control device 3 outputs the voltage having the polarity and magnitude corresponding to the calculated direction and amount of extension and contraction to each of the piezoelectric elements 12.

Figure 20:
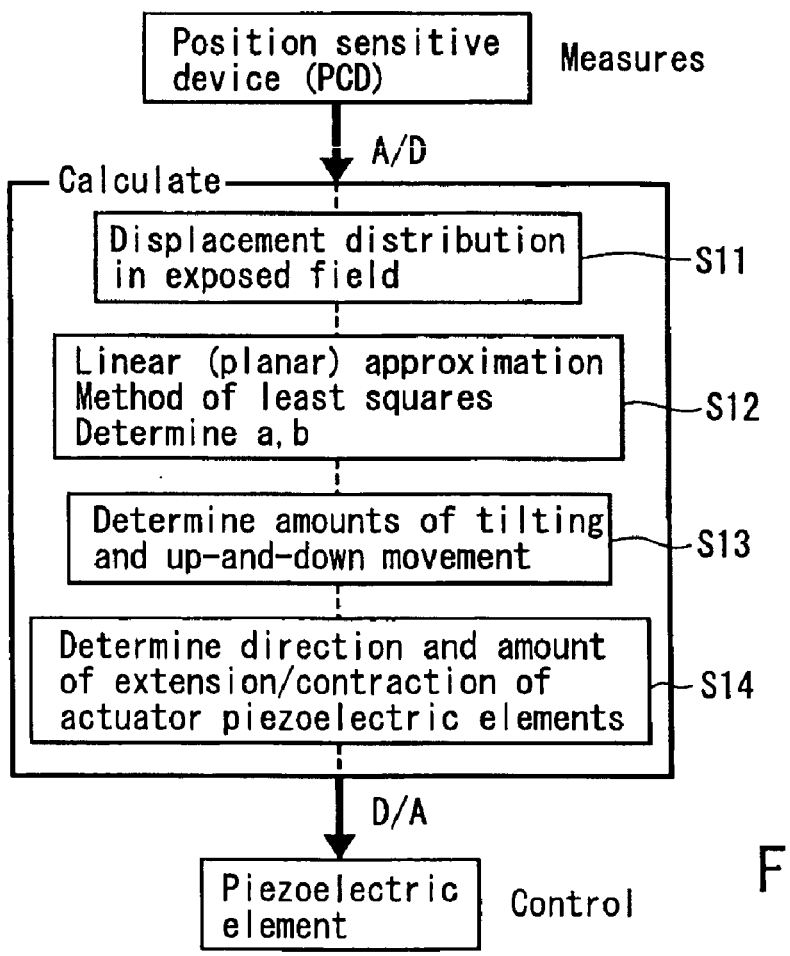
FIG. 20 is a schematic chart explaining an example of a method of setting an operation amount (control amount) of a piezoelectric element in the "undulation correction"

For example, as illustrated in FIG. 20, displacement distribution (direction and displacement amount of the fluctuation or the thickness unevenness) in an exposure field are calculated on the basis of the (A/D-converted) output from the PSD 23 (S11).

From the displacement distribution obtained at S11, a and b of a correction amount z as represented by:

$$z=ax+b$$

are specified by linear (planar) approximation, for example, the method of least squares (S12).

On the basis of the correction amount z (a, b) obtained at 512, an amount of tilting and an amount of up-and-down movement for local deformation of the glass substrate a retained by the retaining means 1 are obtained (S13).

On the basis of the amount of tilting and up-and-down movement obtained at S13, the operational direction, i.e., extension/compression and its control amount (extension amount/compression amount) for each of the piezoelectric elements (deforming means) 12 aligned in a predetermined method on the stage 13, are obtained (514).

The operational direction (extension/compression) and its amount (extension amount/compression amount) of each of the piezoelectric elements 12 thus obtained, are converted into a voltage of polarity and magnitude which is to be supplied to the piezoelectric elements 12, by a D/A converter (not illustrated).

According to the other linear approximation algorithms amount of tilting is determined from maximum and minimum value and amount of up-and-down movement is determined from average value.

Correction of the fluctuation or the thickness unevenness of an influence may be performed one-dimensionally, in a direction in which the fluctuation or the thickness unevenness of the substrate a is great, similarly to the detection of the fluctuation or the thickness unevenness. In this case, the polarity and the magnitude of the voltage which is output to the piezoelectric elements 12 aligned in a longitudinal direction of the bottom surface of the adsorbing plates 11 are totally equal. By detecting and correcting the fluctuation or the thickness unevenness only one-dimensionally, the structure of the detecting means 2 of the fluctuation or the thickness unevenness and the deforming means becomes simple, and the control of the means becomes easy.

As for the other correction method, the fluctuation or the thickness unevenness may be corrected to make the exposed surface substantially correspond to the image-formed surface, by detecting the fluctuation or the thickness unevenness in the substrate a, and distributing the vacuum adsorbing force (air pressure) of the bottom surface of the substrate a in accordance with the detection to deform the substrate a. In this case, an elastic material may be used for the surface which is in contact with the substrate a, so that the deformation of the substrate a can also follow a great fluctuation.

FIG. 5 pictorially illustrates a substrate processing device, according to an embodiment of the present invention, for example, an exposure device, having a fluctuation correcting device of the exposed surface on which the present invention is accomplished as described above. An image-forming optical system 5 is inserted between an original plate (mask) 4 and the substrate a, and the surface of the substrate a is divided into a plurality of exposure fields c to detect and correct the fluctuation and perform the exposure by unit of the exposure field, by the step-and-repeat scheme.

In a case where the substrate a is provided horizontally, an initial voltage to be applied to the piezoelectric elements 12 is first set at 0 V (a referential voltage by calibration) so that all of the piezoelectric elements 12 are of the same height, and the substrate a is loaded on the stage and retained by the adsorbing plates 11.

Then, the substrate a is scanned along a direction of the longer edge with the laser beam of the semiconductor laser 21, to detect the one-dimensional fluctuation or thickness unevenness in the exposure field (see FIG. 1).

Next, the piezoelectric elements 12 in the exposure field are operated (displaced) to deform the substrate a, in a direction opposite to the direction of the detected fluctuation or thickness unevenness, and the fluctuation or thickness unevenness on the exposed surface of the substrate a is corrected.

In other words, when the direction of the fluctuation or thickness unevenness is upward (in a direction orthogonal to the surface direction of the substrate a), the piezoelectric elements 12 are compressed to pull down the exposed surface. When the direction of the fluctuation or thickness unevenness is downward (in a direction orthogonal to the surface direction of the substrate a), the piezoelectric elements 12 are extended to push up the exposed surface.

If the adsorbing plate 11 is in contact with a mountain or a valley of the fluctuation or thickness unevenness, right and left piezoelectric elements 12 of the adsorbing plate 11 are positioned at the same height to move parallel the exposed surface upwardly or downwardly.

If the adsorbing plate 11 is in contact with a portion between a mountain and a valley of the fluctuation or thickness unevenness, the right and left piezoelectric elements 12 of the adsorbing plate 11 are positioned at different heights such that the exposed surface is inclined in a direction of compensating for the fluctuation or thickness unevenness.

Thus, when the height of a substantially entire area of the exposed surface in the exposure field of the substrate a corresponds to the focusing position of the image-forming optical system of the exposure device or the processing device, the original plate 4 is irradiated with the light beam to expose the exposure field c of the substrate a to light.

Figure 19:
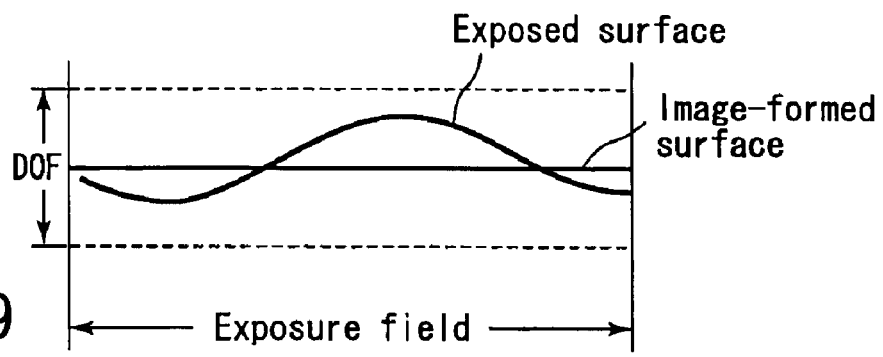
FIG. 19 is a schematic graph explaining a relationship between the substrate deformed by the "fluctuation correction" illustrated in FIG. 18 and defocusing of a pattern exposed to the substrate.

Therefore, the height of the exposed surface is set in the DOF and an image having no blur is formed on the substrate a, in a substantially entire area of the currently selected (exposed) exposure field, as illustrated in FIG. 19.

As for the other exposure method, scanning exposure which performs exposure while simultaneously moving the original plate 4 and the substrate 5 to the image-forming optical system 5, may be employed. In this case, the substrate a may be deformed only to the exposure field c. In addition, the fluctuation or thickness unevenness may be detected simultaneously with (or at a real time with) the exposure or during the step operations, and there is no necessity to preliminarily detect the entire fluctuation or thickness unevenness. In other words, a period of detection and a total processing period required to pass until termination of the exposure can be reduced. In addition, as an area to be deformed at one time becomes smaller, the deforming mechanism can be downsized and its control can be facilitated.

An embodiment of using the piezoelectric elements as the deforming means which deform the substrate a will be described below.

A plate of glass for liquid crystal display (non-alkali glass) having a size of 550×650 mm and a thickness of 0.7 mm is used as the substrate a. The thickness unevenness of this glass substrate basically occurs only in a direction of a longer edge of the substrate. The thickness unevenness is 10 $\mu$m (Peak to Peak) at most, and its fundamental cycle is about 100 mm.

The utilized piezoelectric elements 12 have a stroke of 15 $\mu$m.

The length of the adsorbing plates 11 is equal to the shorter edge of the substrate a. Totally thirteen deforming elements 10 (see FIG. 2), having the vacuum adsorbing openings or tubes b and the piezoelectric elements 12, are arranged at a pitch of 50 mm, i.e., a half of the fundamental cycle of the thickness unevenness of the substrate a along the direction of the longer edge.

The substrate a is loaded on the stage 13 in which the deforming elements 10 are provided, the fluctuation or the thickness unevenness of the surface a is detected while the substrate a is adsorbed by the adsorbing plates 11, and corresponding voltages are applied to the respective piezoelectric elements 12 in accordance with the detection information to correct the fluctuation or the thickness unevenness. The displacement amounts of the right and left piezoelectric elements 12 are different and the height of the deforming elements 10 is uneven so that the deforming elements 10 can be in closer contact with the substrate a.

Step exposure is performed in an exposed field which is 100 mm square, by lens projection exposure, while the above conditions are maintained. At this time, the minimum line width is 1 $\mu$m, and the DOF is:

$\lambda=0.365$ $\mu$m (utilized wavelength), $k=1.0$ $DOF=k \cdot R^2/\lambda=2.7$ $\mu$m Therefore, a complete resist pattern on the entire surface of the substrate a can be obtained though, in general, the substrate a having the fluctuation or the thickness unevenness which is 10 $\mu$m, with the fundamental cycle of 100 mm, cannot partly be resolved.

As described above, according to the embodiment, the fluctuation or the thickness unevenness on the substrate surface can be corrected to make the exposed surface enter the DOF of the image-forming optical system, during the exposure time, by the device correcting the fluctuation or the thickness unevenness which is handled as the waviness existing on the substrate surface, i.e., the exposed surface. Therefore, separation of the image-formed surface and the exposed surface caused by the fluctuation or the thickness unevenness on the substrate surface can be decreased, and blur of the exposure pattern formed on the exposed surface can be reduced even when the exposure pattern is exposed by the exposure device having a narrow DOF. As a result, the ultra fine pattern can be processed on a glass substrate utilized for a liquid crystal display and the like, particularly, a substrate (a processed article) having great fluctuation or thickness unevenness.

Next, a further specific embodiment of the present invention will be described with reference to the attached drawings.

Figure 6:
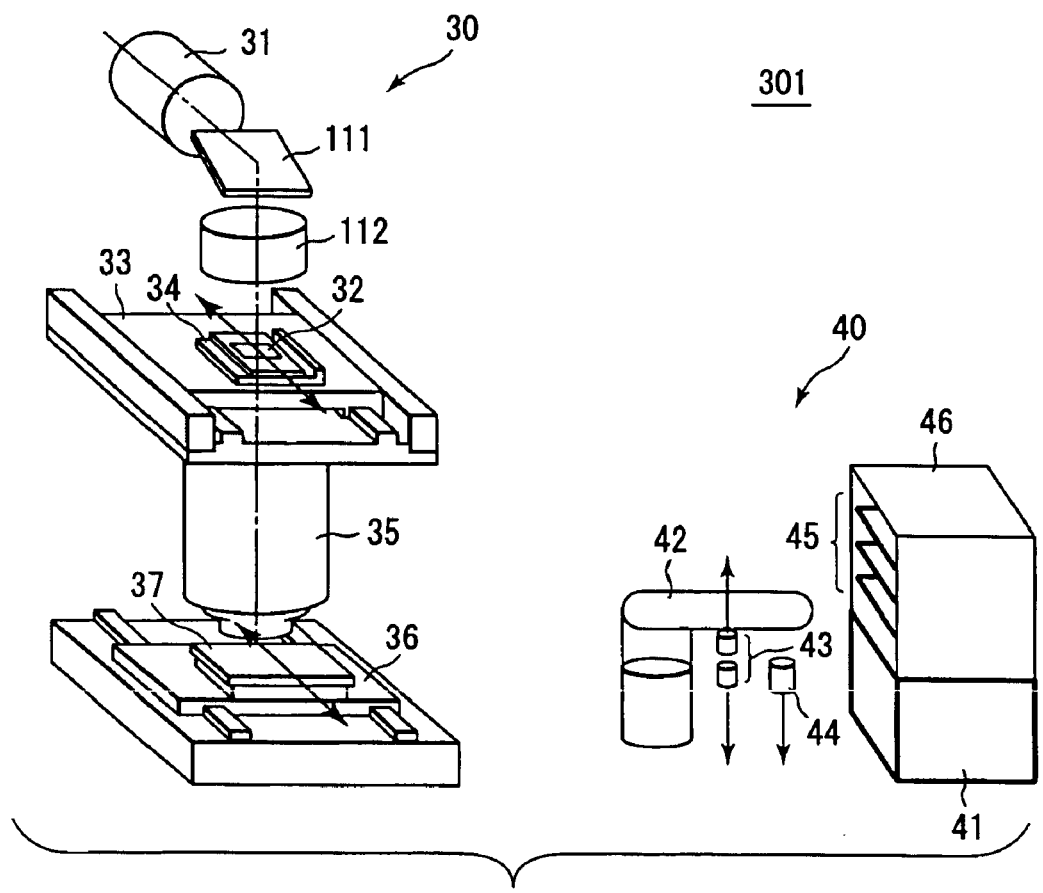
FIG. 6 is a schematic view illustrating an example of applying the present invention to a pattern exposing device, according to an embodiment of the present invention.

FIG. 6 shows a schematic view of an exposure device according to an embodiment of the present invention.

An exposure device 301 exposing a pattern to a glass substrate includes an exposure performing section 30 and a substrate thickness measuring section 40.

The exposure performing section 30 has, for example, an illuminating system (an illuminating device) 31, a mask (original plate) 32, a mask scanning stage 33, a mask holder 34, an image-forming optical system 35, a substrate scanning stage 36, a substrate deforming section 37 and the like.

The substrate thickness measuring section 40 has a loader 41, a robot arm 42, a double-side thickness sensor 43, an underside thickness sensor 44, a substrate to be exposed 45, a substrate cassette 46 and the like.

The exposure device 301 of FIG. 6 adopts the step-and-scan scheme. However, an exposure device of the step-and-repeat scheme can also be designed to have the same structure.

The illuminating system 31 is a light source, for example, a KrF excimer laser device which emits light having sufficient wavelength and energy to expose and photosensitize a member to be exposed, for example, a resist layer. In this embodiment, the laser light beam which is output from the light source 31 is deflected at approximately 90 degrees at a reflection mirror 111.

The laser light beam deflected at 90 degrees by the reflection mirror 111 is given a predetermined cross-sectional beam shape by an optical lens 112 which extends or reduces a cross-sectional beam shape to a shape and/or size of a light beam capable of being applied to the prefixed mask 32.

The mask 32 is arranged at a focusing position of the optical lens 112 and supplies a predetermined exposure pattern (i.e., an optical image) to the resist layer which is preliminarily applied to a predetermined surface of the glass substrate 42. The exposure pattern formed by the optical image, i.e., the mask 32 is a circuit pattern or a MOS-TFT structure pattern.

The mask scanning stage 33 moves the mask 32 which is temporarily fixed at the mask holder 34, in a predetermined direction, for example, direction x, by a predetermined program.

The image-forming optical system 35 forms the optical image which has passed through the mask 32 on the surface of the resist layer.

The substrate scanning stage 36 can be moved in the same direction as the mask 32, for example, the direction x, at a predetermined timing, by predetermined steps.

The substrate deforming section 37 is an adsorbing mechanism or the one-dimensional adsorbing plate as described above in FIG. 2, deforming the substrate having the undulation or thickness unevenness on its surface, in a direction of compensating for the undulation. The adsorbing force of the adsorbing plate can be varied in a predetermined range on the basis of the magnitude of the undulation or thickness unevenness of the substrate 45. In this case, for example, the discharge amount of the pump 14 (see FIG. 1) may be varied directly or an adjusting mechanism (not shown), for example, an electromagnetic valve or the like may be provided at a predetermined position of the pipe 14a and its opening may be controlled by the control device 3. As for the adsorbing plate, temporary fixing means for vacuum adsorption, electrostatic chuck or the like in which a number of suction apertures connected to a vacuum pump are aligned, are most suitable.

The loader 41 is a mechanism positioning the substrate cassette 46 which contain an arbitrary number of members to b exposed, i.e., substrates 45 for exposure so that they can be automatically taken out by the robot arm 42. This positioning mechanism can be moved to a predetermined height (position) by a drive transmission mechanism (not shown), so that the substrate 45 to be exposed next can be taken out by the robot arm 42. As for the drive transmission mechanism, for example, a ball screw or the like can be utilized.

The robot arm 42 contains a mechanism taking out the substrate 45 to be exposed next from the substrate cassette 46 and positioning and mounting the substrate 45 at a predetermined position of the substrate scanning stage 36.

A portion of the robot arm 42 which contacts the substrate 45 should preferably be formed of a metal, for example, aluminum whose surface is aluminized as generation of garbage can be reduced.

The robot arm 42 is supported by an operation rod which is rotatable at 360 degrees in an arbitrary direction of X-Y-R•θ of the robot. The robot is, for example, a scholar robot.

The double-side thickness sensor 43 or the underside thickness sensor 44 detects the amount of the undulation or the thickness unevenness of the substrate 45 by measuring the thickness of the substrate 45 from the top side and the underside thereof. The double-side thickness sensor 43 and the underside thickness sensor 44 are connected to a signal processing system (for example, the control device 3 illustrated in FIG. 1). Both the double-side thickness sensor 43 and the underside thickness sensor 44 are illustrated in FIG. 6. Actually, however, at least either of them may be provided.

The substrate 45 is formed by, for example, sequentially stacking a base insulator layer, an amorphous semiconductor layer, a resist layer and the like on the glass substrate for a liquid crystal display device.

The substrate cassette 46 configured to contain the substrates 45 is mounted on the loader 41. The substrates 45 are arranged at a predetermined equal interval in the substrate cassette 46 so that they can be automatically loaded by the robot arm 42.

Next, conveying process to expose the substrate 45 will be described.

Figure 8:
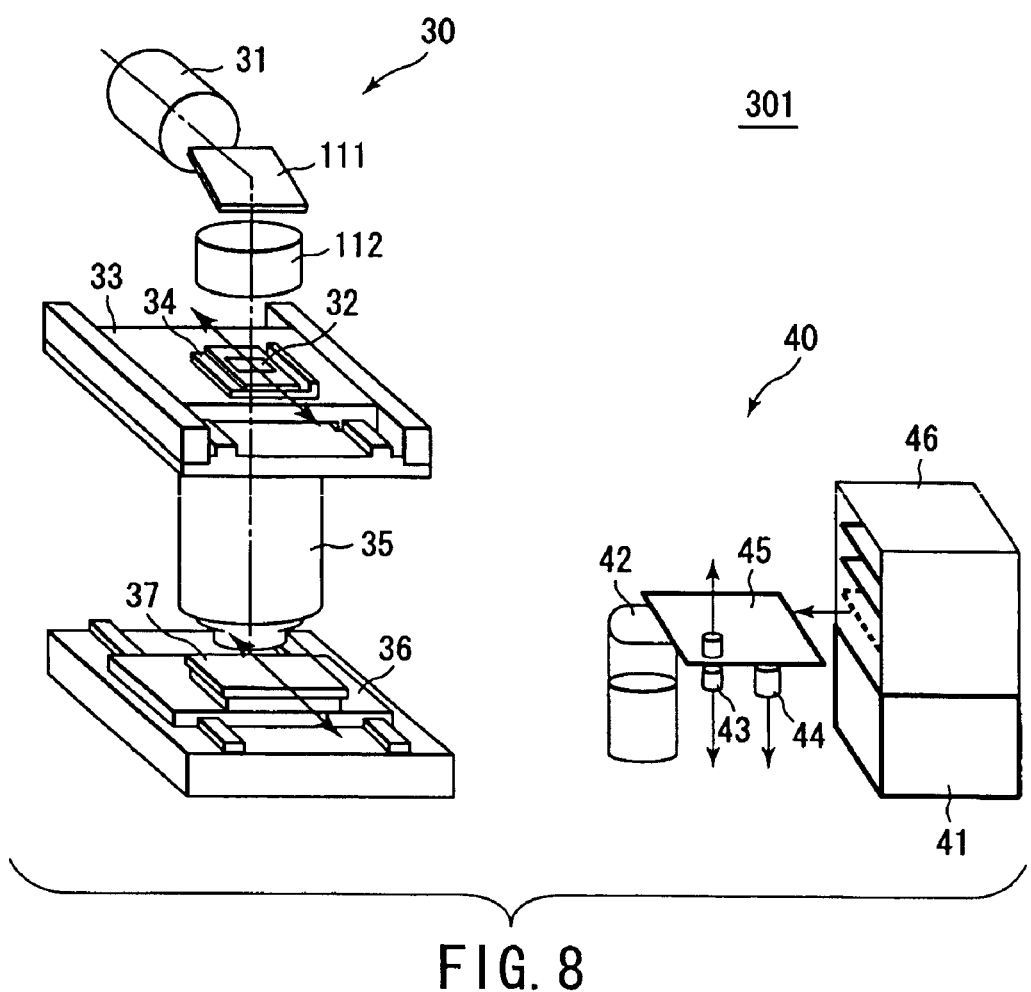
FIG. 8 is a schematic view illustrating an example of an operation of the exposure device illustrated in FIG. 6 (i.e., taking out the exposed substrate)

First, an arbitrary one of the substrates 45 contained in the substrate cassette 46 is conveyed to a predetermined position where the sensors 43 and 44 are provided, by the robot arm 42 (S101, conveying step). In other words, as shown in FIG. 8, the substrate 45 contained at a predetermined position is taken out of the substrate cassette 46 by the robot arm 42.

Next, the substrate 45 is stopped by a sensor section having the sensors 43 and 44, and the inherent undulation or thickness unevenness of the substrate 45 is measured (S102, measuring step). The measuring step is a step of measuring the thickness of the substrate 45 or glass substrate on the robot arm 42 by the sensor 43 or 44. In a case of the glass substrate in which the thickness is varied at a certain cycle of interval which is a few millimeters, the thickness may be measured one-dimensionally by scanning a measurement point in a direction in which the variation in thickness is great (i.e., direction x of FIG. 7). This is because it is known that the characteristic of the undulation or thickness unevenness of the glass substrate is substantially one-dimensional due to the producing method of the glass substrate as described above in FIG. 23.

Figure 7:
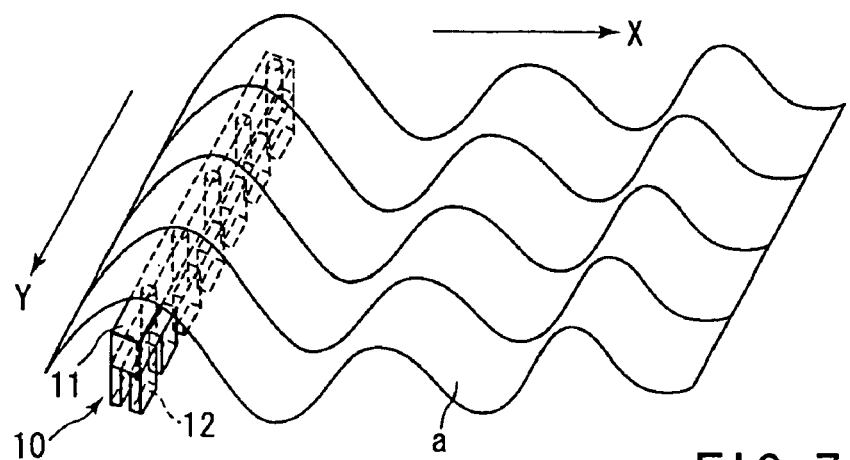
FIG. 7 is a schematic view illustrating a relationship between (uniaxial) fluctuation of a substrate and a direction of measurement made by a one-dimensional thickness measurement sensor.

Therefore, as the variation in thickness occurs at a certain cycle, the thickness variation data of the entire surface can be obtained by scanning at one time, and the time to measure the variation in thickness of the substrate 45 can be reduced. In this measurement, the measurement positions may be scanned two-dimensionally over the entire surface, at an interval of some millimeters. However, if the waviness is regular as illustrated in FIG. 7, the measurement time is shorter than the time of the one-dimensional measurement. In addition, this measurement is sufficiently applicable for the substrate having great variation in thickness in one direction, such as the glass substrate as illustrated in FIG. 7.

Thus, the substrate 45 placed previously in the substrate deforming section 37 should preferably be positioned and exposed by the exposure performing section 30 at the time of measuring the undulation or thickness unevenness of the substrate 45, and the exposure time can be reduced.

After that, the substrate 45 is moved from the substrate cassette 46 to the substrate deforming section 37 by the robot arm 42.

The surface of the substrate 45 is flattened at the substrate deforming section 37, and the optical image (i.e., a MOS-TFT or thin-film transistor pattern) which has passed through the mask 32 is formed on the surface of the resist layer of the semiconductor thin film formed in advance on the substrate, by the image-forming optical system 35. The following step is performed as occasion requires.

When the liquid crystal display panel is formed, a first glass substrate on which a TFT pattern is formed by the above steps, and a second glass substrate on which a predetermined pattern for an opposite substrate is formed while the undulation or thickness unevenness is corrected in the same steps, are provided oppositely at a predetermined interval, an electrochemical substance, for example, a liquid crystal material having a predetermined thickness is arranged between both the substrates, the interval between both the substrates is made air-tight and a drive circuit is added.

Figure 9:
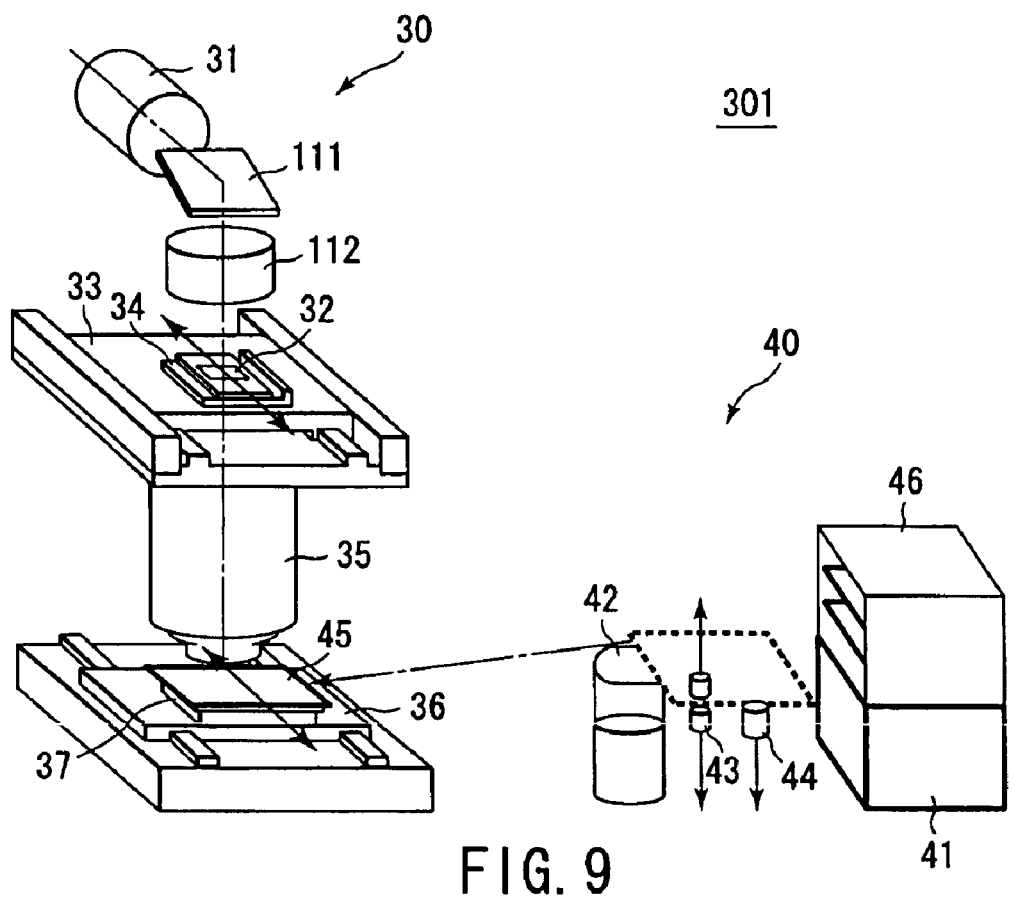
FIG. 9 is a schematic view illustrating an example of an operation of the exposure device illustrated in FIG. 6 (i.e., placing the exposed substrate on a substrate retaining portion)

Next, the operation of the exposure device of FIG. 6 will be described in detail with reference to FIG. 8 and FIG. 9. In FIG. 8 and FIG. 9, the same portions as those of FIG. 6 are denoted by the same reference numerals, and their explanations are omitted here.

At a conveying step (S103), the substrate 45 on the robot arm 42 whose thickness has been measured is conveyed to a predetermined position of the substrate deforming section 37 as illustrated in FIG. 9.

Next, a flattening step (S104) is performed in the following manner. The surface of the substrate deforming section 37 is controlled to be wavy (i.e. move in a vertical direction) on the basis of the measurement data of the thickness unevenness so as to flatten (cancel) the exposed surface of the substrate 45, during the operating of conveying the substrate 45.

Next, positioning the substrate 45 and an exposing step are performed (S105).

When the exposing step has been terminated, the substrate 45 is contained to a substrate cassette 46 which contains other exposed substrates or the same substrate cassette 46 (S106). Otherwise, the exposed substrate 45 may be conveyed to a next step, for example, a developing device.

Figure 10:
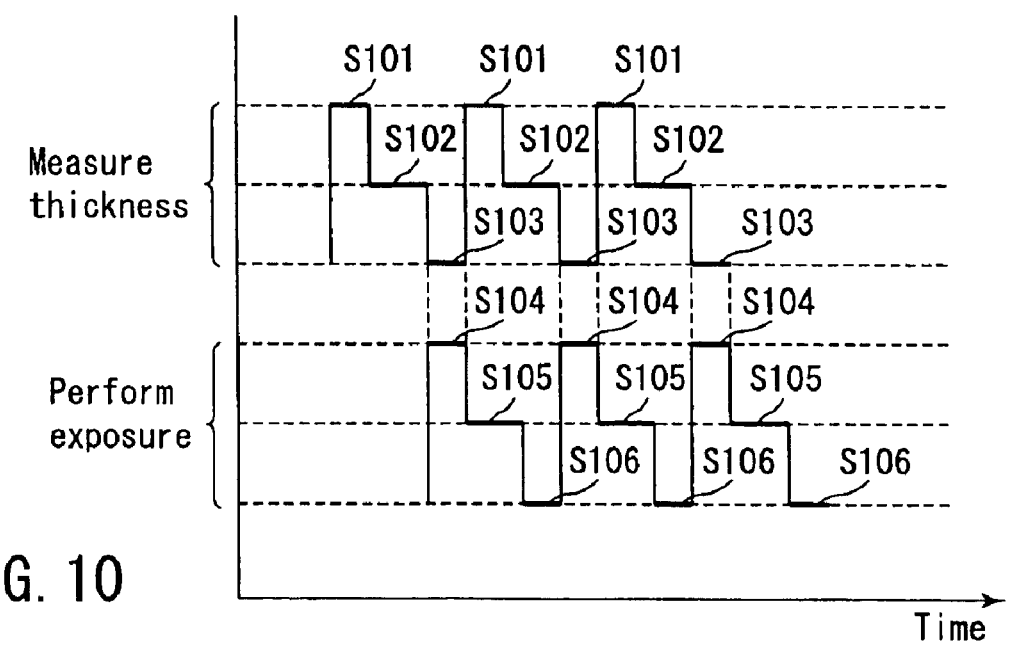
FIG. 10 is a time chart illustrating steps of measuring thickness of the substrate and exposing the pattern to the substrate, by the exposure device illustrated in FIG. 6.

Next, the conditions of reducing the exposure process time will be described with reference to a time chart of FIG. 10 illustrating the above steps.

In FIG. 10, taking out the substrate 45 (S101), the measuring step of measuring the thickness of at least the exposed area of the substrate 45 (S102), and the conveying step of conveying the substrate 45 to the substrate deforming section 37 (S103) overlap the flattening step of making the waviness on the surface of the substrate deforming section 37 (S104), the exposing step of positioning and exposing the substrate 45 (S105), and the conveying step of containing the substrate 45 in the substrate cassette 46 (S106).

It is therefore understood that the time required to pass until the termination of exposure of the substrate can be reduced as compared with a case of employing the known exposure device in which the detection of the undulation or thickness unevenness of the substrate and the exposing step are performed independently.

Next, another embodiment of the exposure device described above in FIG. 6 will be described with reference to FIG. 11.

Figure 11:
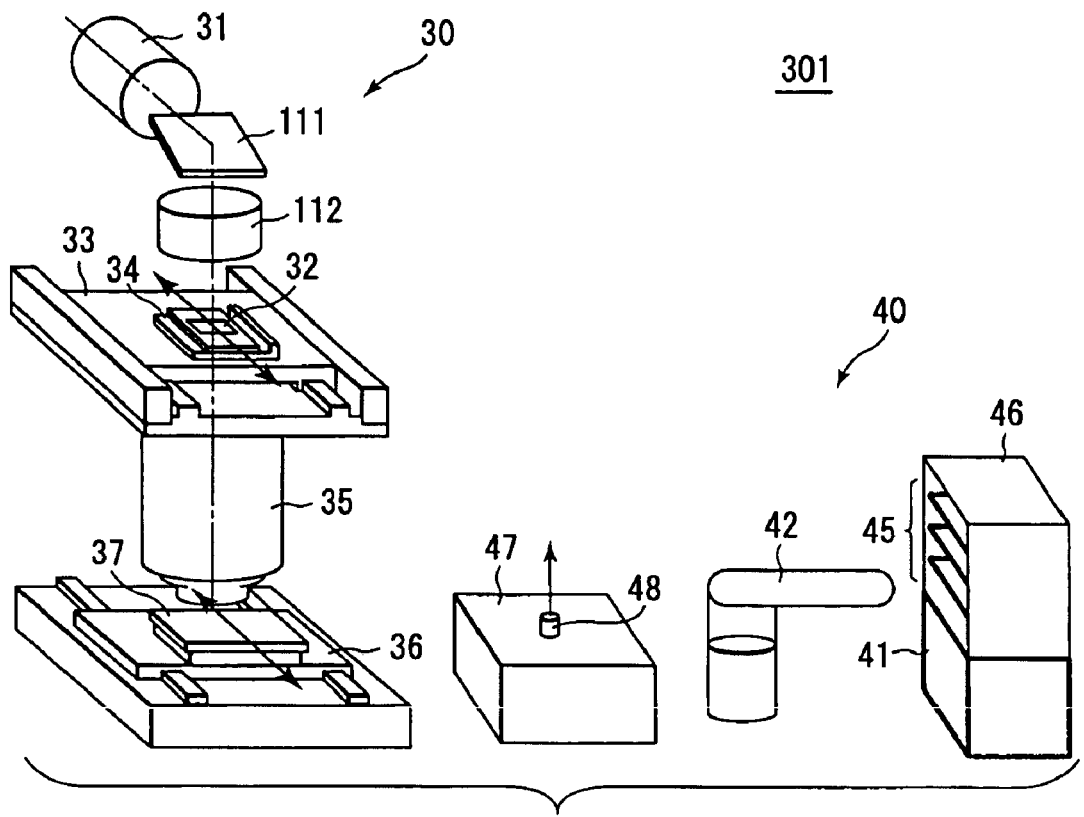
FIG. 11 is a schematic view illustrating another example of applying the present invention to a pattern exposing device, according to an embodiment of the present invention.

The characteristic of the exposure device in FIG. 11 is to provide a stage 47 for measurement of waviness and a sensor 48 of surface waviness, instead of the double-side thickness sensor 43 and the underside thickness sensor 44 of FIG. 6. The same portions as those of FIG. 6 are denoted by the same reference numerals, and their detailed descriptions are omitted.

The substrate 45 is conveyed at a predetermined position in the substrate cassette 46.

The substrate 45 is conveyed from the substrate cassette 46 to the stage 47 by the robot arm 42.

The waviness of the surface of the substrate 45 on the stage 47 is measured by the sensor 48.

An output from the sensor 48 is connected to a signal processing system outputting a signal which drives the stage to amplify a projection and depression (undulation) signal of the surface of the substrate 45 and cancel the undulation. The arrangement of the apertures and grooves for vacuum adsorption provided on a surface of the stage 47 which contacts the substrate 45 is the same as that on the substrate deforming section 37.

This is because, as the substrate 45 is deformed even by these apertures and grooves, the substrate 45 placed on the substrate 37 deforming section 37 needs to be in the same condition as that at the measuring time.

Next, an example of handling of the substrate 45 by the exposure device of FIG. 11 will be described with reference to FIG. 13 to FIG. 15.

First, at the conveying step (S201), a predetermined substrate 45 which is to be exposed next is taken out from the substrate cassette 46 by the robot arm 42. This operation is performed by a program prestored in a memory of a control device 101. In other words, a containing position of the substrate 45 to be exposed next is set at a predetermined position by operating the loader 41. This position is preset to insert the substrate 45 into the substrate cassette 46 or take out the substrate 45 therefrom by the robot arm 42. The loader 41 adjusts the positioning of the substrate 45 by rotating a ball screw built in the robot arm 42.

Next, the robot arm 42 is rotated under the control of the control device 101 and inserted between the substrate 45 and a substrate 45 contained under the substrate 45. After that, the robot arm 42 is moved upwardly at a preset amount. The robot arm 42 is operated to return while the substrate 45 is placed on the robot arm 42, and the substrate 45 is thereby taken out from the substrate cassette 46.

Figure 14:
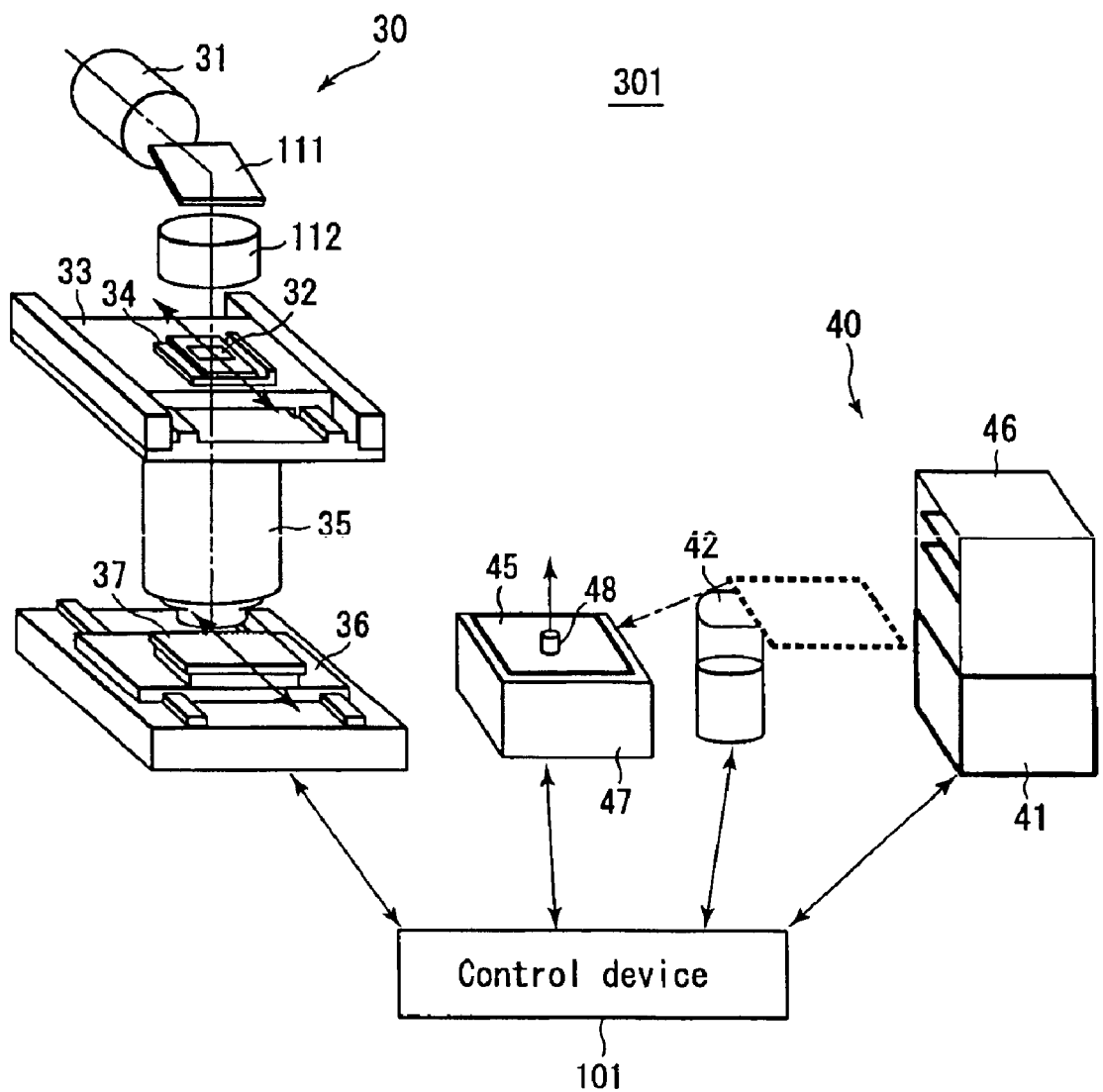
FIG. 14 is a schematic view illustrating an example of an operation of the exposure device illustrated in FIG. 11 (i.e., placing the exposed substrate on a stage for measurement of waviness)

Next, at a conveying step (S202), the substrate 45 on the robot arm 42 is positioned and conveyed to a preset position on the stage 47 and then placed at the position, as illustrated in FIG. 14.

At a projection and depression measuring step (S203), the waviness on the surface of the substrate 45 is measured by the sensor 48.

The measurement data on the waviness of the surface of the substrate 45 obtained by the sensor 48 is stored at a predetermined position of the memory of the control device 101 and utilized for the flattening operation of the substrate 45 surface. After a signal representing termination of the measurement of the waviness on the surface of the substrate 45 is received by the control device 101, the control device 101 controls conveying the substrate 45 on the stage 47 to the predetermined position on the substrate deforming section 37 by the robot arm 42, as illustrated in FIG. 15 (conveying step (S204)).

The control device 101 reads the measurement data stored in the memory during the conveying operation, and controls making the surface of the substrate deforming section 37 wavy on the basis of the measurement data to flatten the exposed surface of the substrate 45 (flattening step (S205)).

In other words, the surface of the substrate 45 placed on the substrate deforming section 37 is controlled to be flat. The flattening operation on the substrate 45 surface may be performed in each exposed area or on the entire surface at one time.

Next, the substrate 45 placed on the substrate deforming section 37 is positioned and exposed to light (exposing step (S206)). The positioning is performed by an operation of making the predetermined reference position of the substrate deforming section 37 agree with a predetermined position of the substrate 45, under the control of the control device 101.

The exposing step is performed, for example, in the step-and-repeat scheme. The operating is performed while sequentially moving the substrate 45 in the uniaxial direction (direction x) as described above with reference to FIG. 7.

After the exposing step has been terminated, the exposed substrate 45 is contained in another substrate cassette 46 or the same substrate cassette 46 (conveying step (S207)). Otherwise, the exposed substrate 45 may be conveyed to the developing device.

Figure 12:
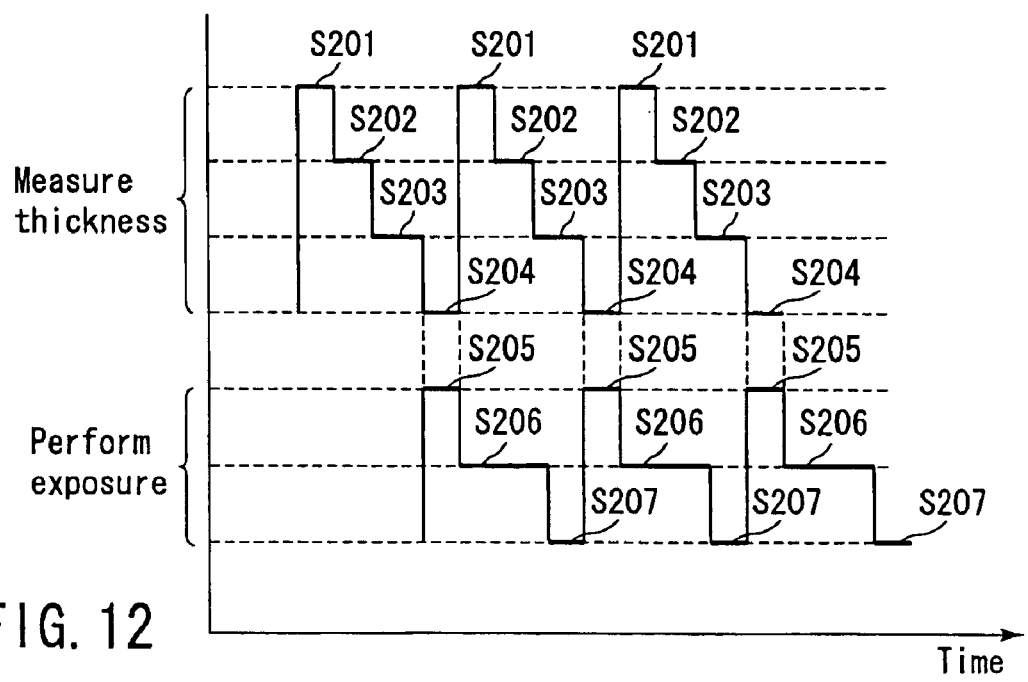
FIG. 12 is a time chart illustrating steps of measuring thickness of the substrate and exposing the pattern to the substrate, by the exposure device illustrated in FIG. 11.
Figure 13:
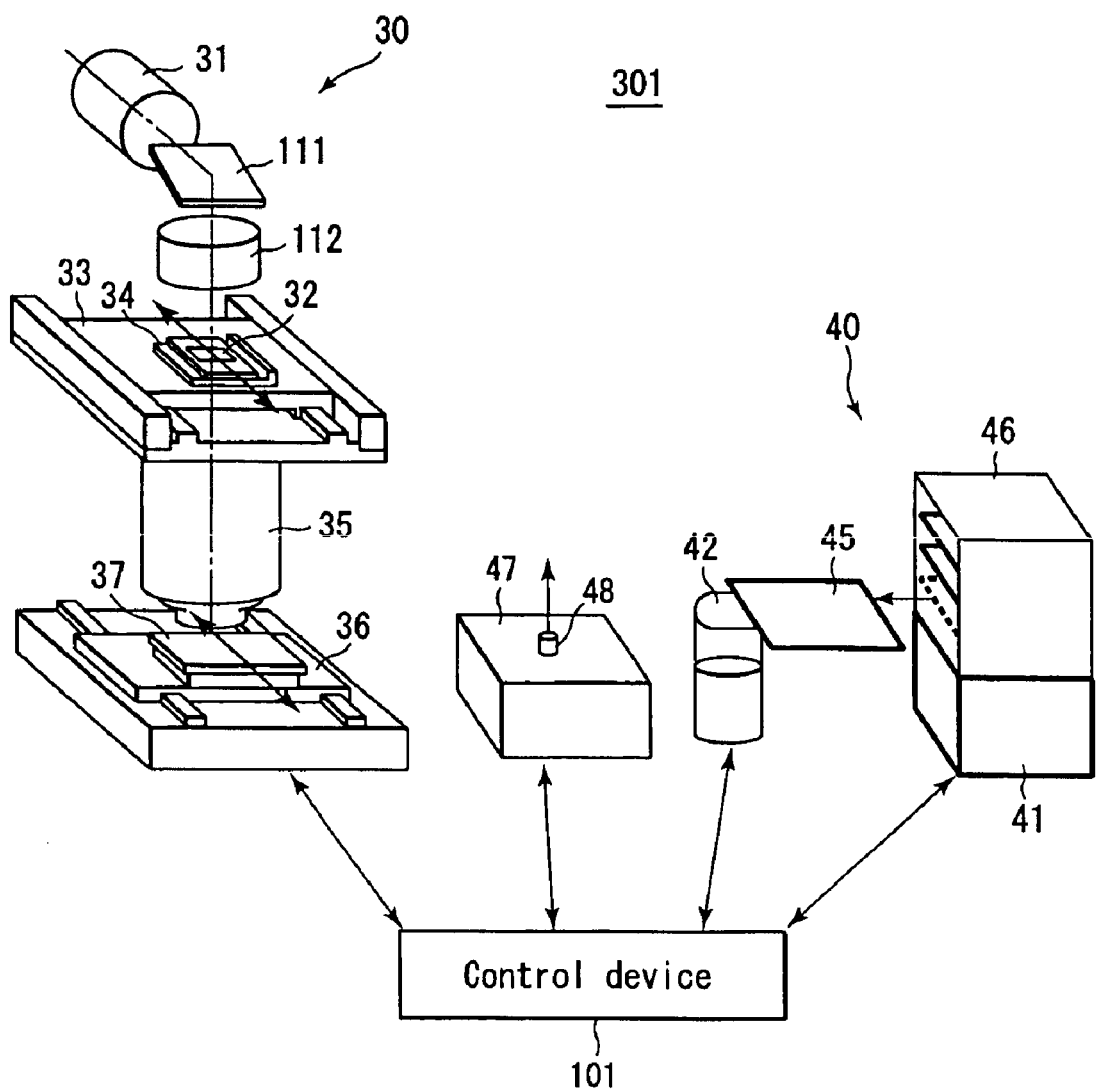
FIG. 13 is a schematic view illustrating an example of an operation of the exposure device illustrated in FIG. 11 (i.e., taking out the exposed substrate)
Figure 15:
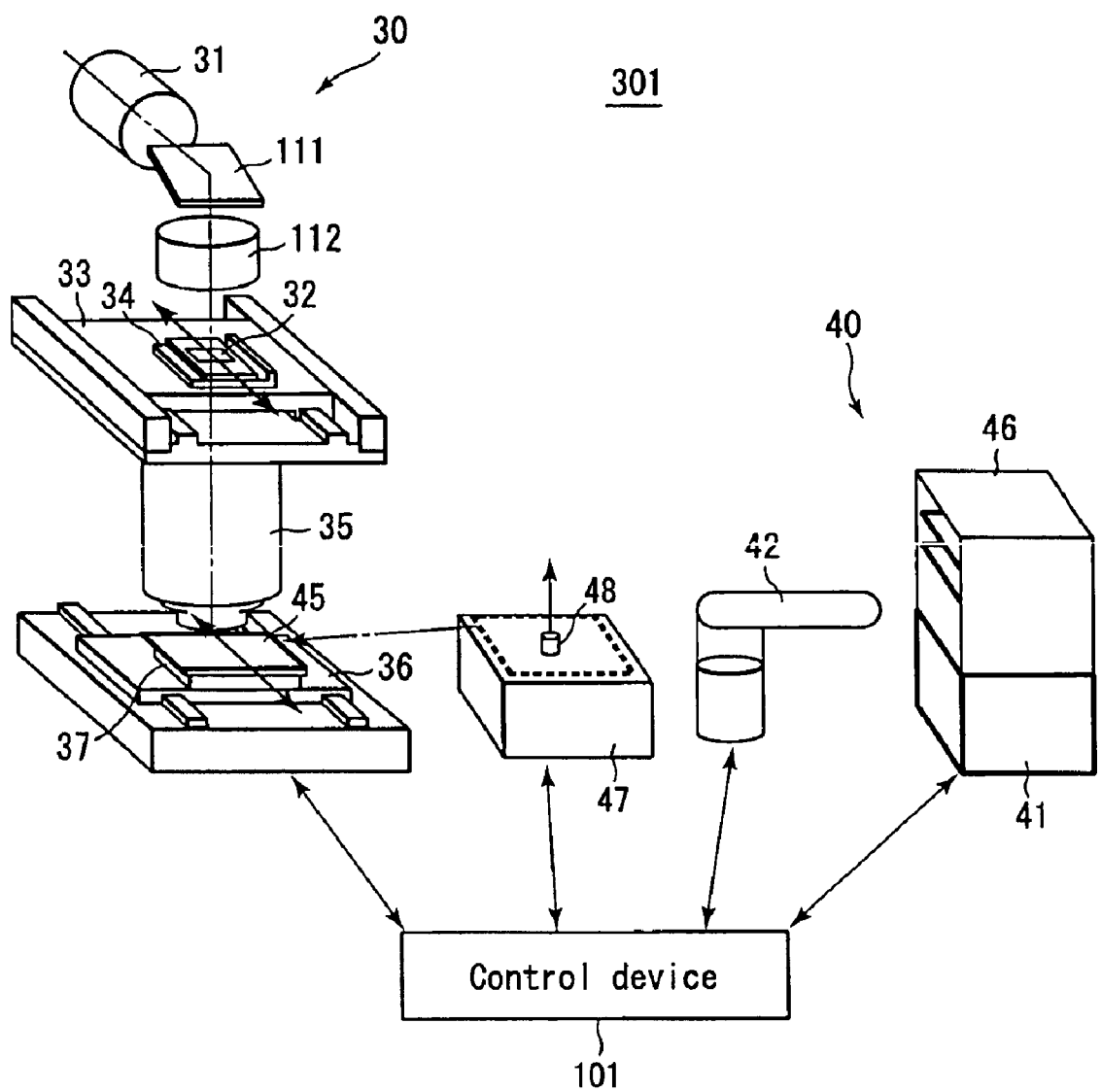
FIG. 15 is a schematic view illustrating an example of an operation of the exposure device illustrated in FIG. 11 (i.e., placing the exposed substrate on a substrate deforming portion)

Next, the conditions of reducing the exposure process time in exposing the substrate by the exposure device of FIG. 11 as illustrated in FIG. 13 to FIG. 15, will be described with reference to a time chart of FIG. 12 illustrating the above steps.

The conveying step of taking out the substrate 45 (S201), the conveying step of conveying the substrate 45 onto the stage 47 (S202), the measuring step of measuring the waviness on the surface of the substrate 45, for example, the thickness of the substrate 45 (S203), and the conveying step of conveying the substrate 45 to the substrate deforming section 37 (S204), overlap the flattening step of making the surface of the substrate deforming section 37 wavy (S205), the exposing step of positioning and exposing the substrate 45 (S206), and the conveying step of containing the substrate 45 in the substrate cassette 46 (S207). It is therefore understood that the time required to pass until the termination of exposure of the substrate can be reduced as compared with a case of employing the known exposure device in which the detection of the undulation or thickness unevenness of the substrate and the exposing step are performed independently.

Next, another specific embodiment of the undulation correcting system illustrated in FIG. 1 and FIG. 2 will be described with reference to FIG. 16.

Figure 16:
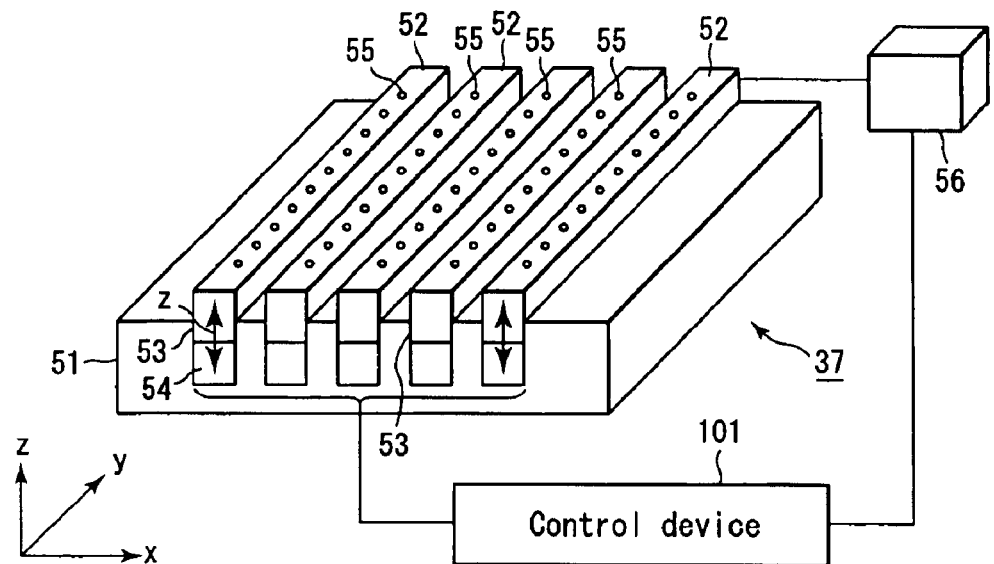
FIG. 16 is a schematic view illustrating another embodiment of the substrate fluctuation correcting device available, according to an embodiment in the present invention.

FIG. 16 illustrates a specific structure of the stage on which the substrate is placed, an embodiment of the exposure device forming the semiconductor device on the glass substrate for the liquid crystal display device.

On a base, for example, a square steel base 51 having a width (direction x) of 400 mm and a length (direction y) of 400 mm, adsorbing plates, for example, rectangular adsorbing plates 52 are aligned in, for example, five rows, at a predetermined interval of, for example, 10 mm. Each of the rectangular adsorbing plates 52 is provided to be movable independently in a vertical direction (direction z).

In this embodiment, all of the rectangular adsorbing plates 52 are of the same length, which is equal to the length of the shorter edge of the substrate 45. The length may be shorter at every one or some plates. The substrate 45 is a square glass substrate having a width of, for example, 300 mm and a length of 320 mm.

The length of the rectangular adsorbing plate 52 of the present case is 320 mm, and the width of the alignment range is, for example, 300 mm. The means for vertically moving the rectangular adsorbing substrates 52 is, for example, a piezoelectric element, an air pressure adjustment device, a ball screw or the like, i.e., means capable of adjusting the amount of vertical movement (in the direction z) by an electric signal formed between the square base 51 and the rectangular adsorbing plates 52. A distance of the movement made by the vertically moving means is, for example, ±10 to 30 $\mu$m as determined by the height of the undulation or thickness unevenness generated on the substrates 45.

In the embodiment of FIG. 16, a groove 53 is formed at a position on the square base 51 where each of the rectangular adsorbing plates 52 is aligned, such that a portion of a bottom side of the rectangular adsorbing plate 52 is fitted in the groove. A piezoelectric element 54 is embedded in each of the grooves 53. The piezoelectric element 54 may be provided to support each of the rectangular adsorbing plate 52 at some portions or may be formed of one elongated band-like member.

The rectangular adsorbing plate 52 is placed in, at least, one row, on the piezoelectric element 54.

A plurality of vacuum adsorbing apertures 55 are provided at an interval which is sufficient to temporarily adsorb the substrate 45, on each of the rectangular adsorbing plates 52. Each of adsorbing apertures 55 is connected to a vacuum pump 56 to independently control the adsorption and separation for each of the rectangular adsorbing plates 52.

A stage 37 (the substrate deforming section) for the exposure device is formed as described above. The adsorbing means of the substrate 45 may be an electrostatic chuck.

Next, a method of conveying the substrate 45 onto the stage 37 will be described.

The data of measuring the undulation or thickness unevenness of the substrate 45 is output to the control device 101. It is assumed that as a result of outputting, the undulation as illustrated in FIG. 7 occurs in the width direction x on the substrate 45.

The control device 101 outputs a command to convey the substrate 45 measured onto the stage 37.

The substrate 45 is positioned in predetermined operation steps such that the length direction of the substrate 45 agrees with the length direction of the rectangular adsorbing plates 52 and the width direction x of the substrate 45 agrees with the aligning direction of the rectangular adsorbing plates 52. As a result, the length direction of the rectangular adsorbing plates 52 agrees with a direction z vertical to the direction x of the undulation illustrated in FIG. 7.

At this time, the control device 101 operates the vacuum pump 56 to generate an effect of vacuum adsorption, urges the substrate 45 to be subjected to vacuum adsorption by the rectangular adsorbing plates 52, and supplies vertical drive information to each of the piezoelectric elements 54 so as to flatten the exposed surface of the substrate 45 surface formed from the undulation or thickness unevenness information.

Figure 21:
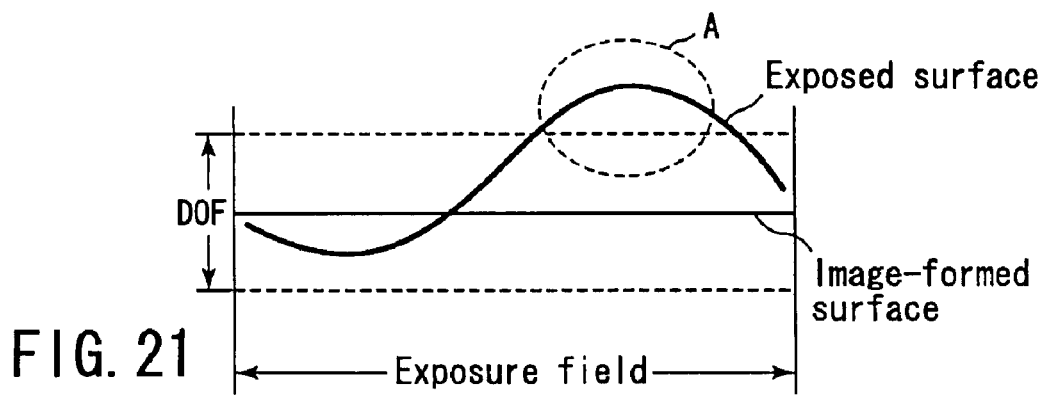
FIG. 21 is a flow chart explaining a relationship between the fluctuation occurring on the substrate and the defocusing of the pattern exposed to the substrate, i.e., separation of an exposed surface and an image-formed surface.
Figure 22:
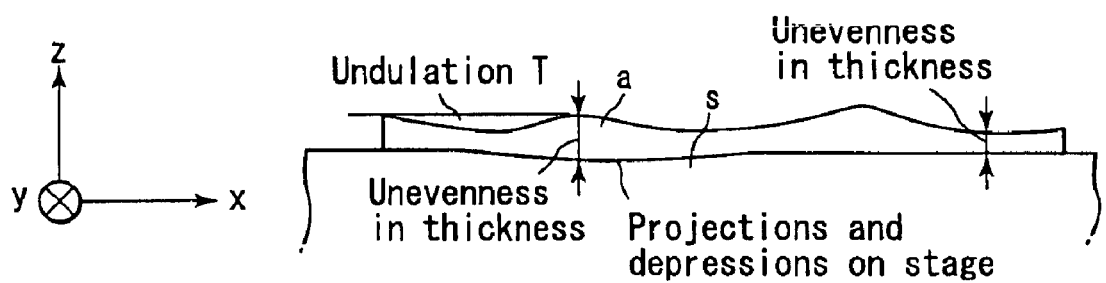
FIG. 22 is a schematic diagram explaining inherent "fluctuation" of a substrate.

The exposed surface of the substrate 45 surface is flattened, at least, in a predetermined width in the direction y (i.e., approximately 10 mm in the direction x), by this effect. If the adsorbing plates 52 and the piezoelectric elements 54 are provided in five rows, the exposed surface of the substrate 45 is flattened in a range of the entire area of the direction y and approximately 50 mm of the direction x, on the glass, i.e., the substrate 45. Flattening the exposed surface of the substrate 45 surface is to vertically move (i.e., adjust the position of) the exposed surface A positioned outside the DOF as described above in FIG. 21 to fall within the DOF as illustrated in FIG. 19.

In the above embodiment, the adsorbing operation of all of the adsorbing plates 52 is performed. In a case of, for example, exposure of the step-and-scan scheme, however, adsorption and vertical movement may be operated for each of the exposed areas.

Figure 17:
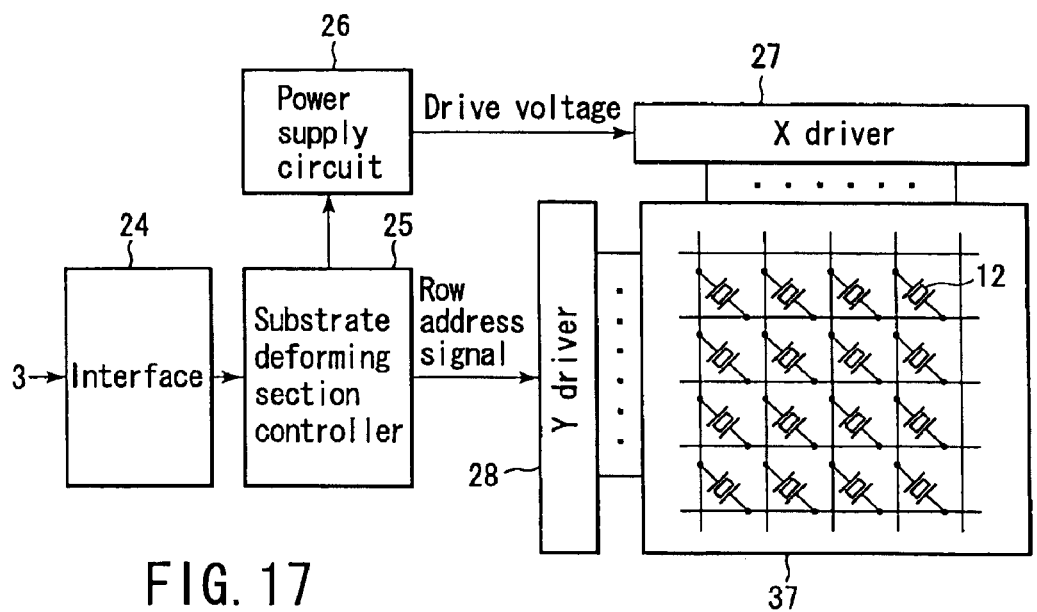
FIG. 17 is a schematic block diagram illustrating an example of a control system controlling a substrate deforming portion which corrects (uniaxial) fluctuation of the substrate as illustrated in FIG. 1.

FIG. 17 is a block diagram showing a control system of the substrate deforming section 37 (stage 37 of the undulation correcting system shown in FIG. 16). The control system of the substrate deforming section 37 inputs the output signal of the control device 3 via an interface 24, supplies a drive voltage and a row selection signal (row address) to an x driver 27 and a y driver 28 via a substrate deforming section controller 25 and a power supply circuit 26, and individually controls the displacement amounts of the piezoelectric elements 12 arranged in predetermined lines (i.e., the adsorbing plates 52) of the substrate deforming section 37. In addition, a switching element and a capacitance element (not shown) are arranged at each of the adsorbing plates 52 to maintain the drive voltage of the piezoelectric element 12 during a certain time.

The output current of the thickness measurement sensor is A/D-converted and input to the control device 3. The direction and displacement amount of the undulation or thickness unevenness of the substrate a are calculated from the converted output current. The control device 3 calculate them so that the exposed surface A outside the DOF illustrated in FIG. 21 falls in the DOF as illustrated in FIG. 19, as described above. In other words, the direction and displacement amount of the undulation are calculated, and the direction and amount of extension and contraction in each of the piezoelectric elements 12 are also calculated in accordance with the relationship in positions of the piezoelectric elements 12 so that all of the points in the exposed surface fall in the range of the DOF. Then, the voltage having the polarity and magnitude according to the direction and amount of extension and contraction is output to each of the piezoelectric elements 12.

Correction of the undulation may be performed only in one dimension in which the thickness unevenness of the substrate 45 is great, similarly to the detection of the undulation. In this case, the polarity and the magnitude of the voltages which are output to the piezoelectric elements 12 aligned in the length direction of the bottom surface of the adsorbing plate 11 become equal. By detecting and correcting the undulation only one-dimensionally, the structure of the detecting means of the undulation and the thickness unevenness and the structure of the deforming means become simple, and the control of the control system of the substrate deforming section 37 becomes facilitated.

The other correction method may be detecting the undulation or the thickness unevenness of the substrate 45, distributing the vacuum adsorbing force (air pressure) on the underside of the substrate 45 in accordance with the detection to deform the substrate 45, and correcting the undulation so as to make the exposed surface substantially correspond to the image-formed surface. In this case, an elastic material may be utilized as the surface contacting the substrate 45 so that the deformation of the substrate 45 can follow great undulation.

Figure 18:
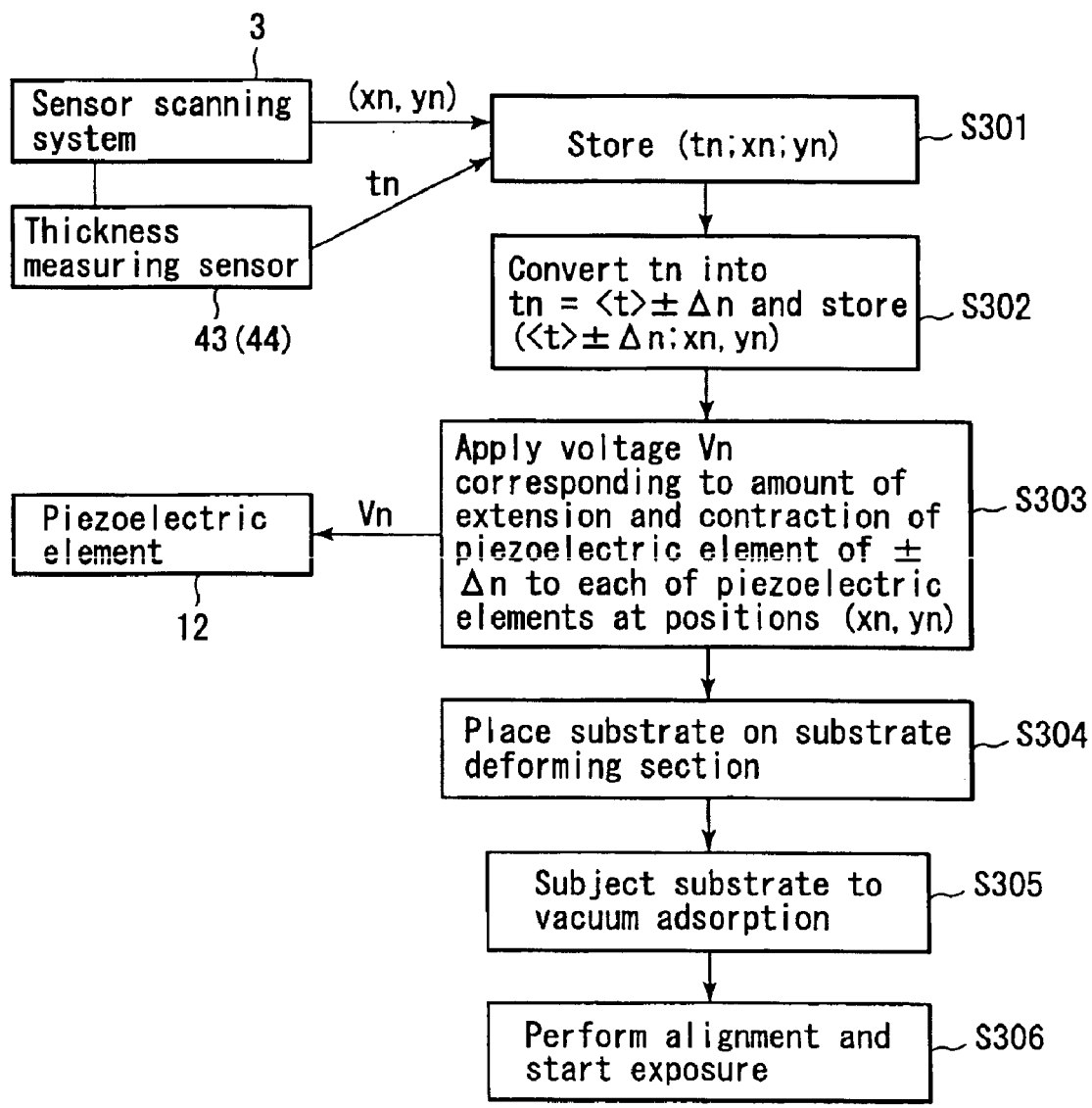
FIG. 18 is a flow chart explaining an example of "fluctuation correction", in the fluctuation correcting device which corrects (uniaxial) fluctuation of a substrate as illustrated in FIG. 1.

Specifically, as shown in FIG. 18, the thickness of the substrate 45 (generally ranging from 0.5 to 1.1 mm) is first measured while scanning the thickness measuring sensor in the direction x of FIG. 7, and the measurement value tn (a value higher than at least a digit of 0.1 µm) and position coordinates (xn, yn) thereof which are output from the sensor scanning system are stored in the memory of the personal computer 3 (step S301). Next, an average value <t> of the thickness is obtained and "tn" is converted into a form of tn=<t>±Δn, which is stored (step S302).

Next, a voltage Vn equivalent to the amount of extension and contraction of the piezoelectric element 12 of ±Δn is applied to each of the piezoelectric elements 12 at positions (xn, yn) (step S303).

The substrate 54 is placed on the substrate deforming section 37 (step S304).

The substrate 45 is subjected to vacuum adsorption (step S305).

Finally, alignment is performed and exposure is started (step S306).

As for the other exposure method, scanning exposure which performs exposure while simultaneously moving the mask 32 and the substrate 45 toward the image-forming optical system 5, may be adopted. In this case, deformation of the substrate 45 may be performed only in the exposure field. Therefore, detection of the undulation may be performed simultaneously with the exposure (at a real time) or during the step operations. As the entire undulation does not need to be detected in advance, the detection time can be reduced. In addition, as the area to be deformed at one time can be smaller, the control becomes facilitated.

Thus, according to the substrate processing device of the present invention, by vertically moving a plurality of adsorbing plates that retain the substrate and performing the exposure so that the exposed surface of the substrate can be flattened, the exposure pattern can be formed exactly within the range of the DOF of the image-forming optical system, on the glass substrate of the liquid crystal display or the substrate which has undulation or thickness unevenness, particularly great thickness unevenness. In other words, the exposure pattern having no blur can be formed certainly in the processing area (substrate surface, i.e., exposed surface) of the substrate (processed article), for use in the exposure device, the processing device, exposure method, the thin film transistor producing method, the display device producing method, and the like.

As described above, according to the present invention, as the maximum value of displacement in the surface direction of the area to be processed in a plate-like member retained by an adsorbing mechanism can be corrected to fall in a smaller predetermined range than the permissible ability of displacement of the processing device, the processing on the plate-like member becomes even.

In addition, a total processing time required to pass until termination of all the steps, particularly, exposure is reduced. The deformation elements to deform the substrate may be prepared linearly or one-dimensionally in accordance with the undulation or thickness unevenness, i.e., characteristics of displacement, and the manufacturing costs of the device can also be reduced.

The present invention is not limited to the embodiments described above and can be modified in various manners without departing from the spirit and scope of the invention.

For example, the present invention can provide:

An apparatus for correcting undulation or thickness unevenness on an exposed surface of an article to be exposed, comprising:

retaining means for retaining a substrate on a stage;

deforming means for effecting an external force to the retaining means and deforming the substrate;

detecting means for detecting the undulation or thickness unevenness on the surface of the substrate retained by the retaining means;

control means for controlling the deformation of the substrate in a direction of canceling the detected undulation or thickness unevenness; and exposure means comprising an image-forming optical system between an original plate and the substrate, for exposing an exposure pattern of the original plate to the surface of the substrate, wherein during an exposure time, the undulation or thickness unevenness on the surface of the substrate is corrected so that the exposed surface falls in a depth of focus of the image-forming optical system.

The present invention can also provide:

An apparatus for correcting undulation or thickness unevenness on an exposed surface of an article to be exposed, comprising:

retaining means having adsorbing means for adsorbing and retaining a substrate;

deforming means for effecting an external force to the retaining means and deforming the substrate;

detecting means for detecting the undulation or thickness unevenness on the surface of the substrate retained by the retaining means;

control means for controlling the deformation of the substrate in a direction of canceling the detected undulation or thickness unevenness; and exposure means having an image-forming optical system between an original plate and the substrate, for exposing an exposure pattern of the original plate to the surface of the substrate, wherein the deforming means deforms the substrate by controlling an adsorbing force of the adsorbing means and, during an exposure time, corrects the undulation or thickness unevenness on the surface of the substrate so that the exposed surface falls in a depth of focus of the image-forming optical system.

The present invention can further provide:

An apparatus for correcting undulation or thickness unevenness on an exposed surface of an article to be exposed, comprising:

retaining means for retaining a substrate on a stage;

deforming means for effecting an external force to the retaining means and deforming the substrate;

detecting means for detecting the undulation or thickness unevenness on the surface of the substrate retained by the retaining means;

control means for controlling the deformation of the substrate in a direction of canceling the detected undulation or thickness unevenness; and exposure means having an image-forming optical system between an original plate and the substrate, for exposing an exposure pattern of the original plate to the surface of the substrate, wherein during an exposure time, the undulation or thickness unevenness on the surface of the substrate is corrected, only one-dimensionally along a direction in which the undulation or thickness unevenness on the surface of the substrate is great, so that the exposed surface falls in a depth of focus of the image-forming optical system.

The present invention can still further provide:

An apparatus for correcting undulation or thickness unevenness on an exposed surface of an article to be exposed, comprising:

retaining means for retaining a substrate on a stage;

deforming means for effecting an external force to the retaining means and deforming the substrate;

detecting means for detecting the undulation or thickness unevenness on the surface of the substrate retained by the retaining means;

control means for controlling the deformation of the substrate in a direction of canceling the detected undulation or thickness unevenness; and exposure means having an image-forming optical system between an original plate and the substrate, for exposing an exposure pattern of the original plate to the surface of the substrate, wherein the exposure means performs exposure in each exposure field in which an exposure area is smaller than a substrate area, and the deforming means deforms the substrates by unit of the exposure field.

The present invention can still further provide:

An apparatus for correcting undulation or thickness unevenness on an exposed surface of an article to be exposed, comprising:

retaining means for retaining a substrate on a stage;

deforming means for effecting an external force to the retaining means and deforming the substrate;

detecting means for detecting the undulation or thickness unevenness on the surface of the substrate retained by the retaining means;

control means for controlling the deformation of the substrate in a direction of canceling the detected undulation or thickness unevenness; and exposure means having an image-forming optical system between an original plate and the substrate, for exposing an exposure pattern of the original plate to the surface of the substrate, wherein a unit of the substrate exposed by the exposure means is an exposure field smaller than a substrate area and the substrate is deformed by unit of the exposure field, by the exposure means.

What is claimed is:

1. An exposure device exposing an exposure pattern to a substrate, comprising:

detecting means for detecting undulation or thickness unevenness each extending in a first direction on a surface of a substrate;

retaining means for supporting the substrate, the retaining means including, support mechanisms configured to be elongated in a second direction orthogonal to the first direction of the undulation or thickness unevenness detected by the detecting means, the support mechanisms being arranged in the first direction of the undulation or thickness unevenness, and support mechanism adsorbing plates configured to be independently displaced in a third direction of displacement orthogonal to the surface of the substrate; and a plurality of adsorbing means for adsorbing and retaining the substrate provided on the retaining means of the support mechanisms along a length direction of the support mechanisms.

2. The exposure device according to claim 1, wherein the support mechanisms comprise any of piezoelectric elements whose displacement amount along a direction of displacement can be varied, displacement mechanisms using an air pressure, and motor drive mechanisms.

3. The exposure device according to claim 2, wherein the support mechanisms are linear or one-dimensional members.

4. The exposure device according to claim 1, wherein a length of the retaining means extending along the first direction is greater than or equal to a length of the substrate in the first direction.

5. The exposure device according to claim 1, wherein the adsorbing means comprise any of suction means, vacuum suction means, and electrostatic chucks.

6. The exposure device according to claim 5, wherein an adsorbing force of the adsorbing means can be varied in accordance with magnitude of the undulation or thickness unevenness on the substrate.

7. The exposure device according to claim 1, wherein the detecting means receive a reflected beam of light applied to the surface of the substrate and measure the undulation or thickness unevenness on the surface of the substrate.

8. The exposure device according to claim 1, wherein the support mechanisms of the retaining means are arranged at an interval of a half of or smaller than a fundamental cycle of the undulation or thickness unevenness on the substrate.

9. The exposure device according to claim 1, further comprising elastic members provided on sides of the adsorbing means which are in contact with the substrate.

10. The exposure device of claim 1, wherein a length of the retaining means extending along the second direction is greater than or equal to a length of the substrate in the second direction.

11. A device for processing a member on a stage, comprising:

detecting means for detecting undulation or thickness unevenness in a first direction on a surface of a member;

retaining means for supporting the member, the retaining means including, adsorbing plates configured to be elongated in a direction orthogonal to the first direction of the undulation or thickness unevenness of the surface of the member, the adsorbing plates configured to be aligned in the first direction of the undulation or thickness unevenness, the adsorbing plates configured to be independently displaced in a third direction of displacement orthogonal to the surface of the member; and adsorbing means for adsorbing the member, provided on the respective adsorbing plates.

12. An exposure device exposing an exposure pattern to a substrate, comprising:

detecting means for detecting undulation or thickness unevenness each extending in a first direction on a surface of a substrate;

retaining means for supporting the substrate, the retaining means including, support mechanisms configured to be elongated in a second direction orthogonal to the first direction of the undulation or thickness unevenness, and support mechanism adsorbing plates configured to be independently displaced in a third direction of displacement orthogonal to the surface of the substrate; and a plurality of adsorbing means for adsorbing and retaining the substrate provided on the retaining means of the support mechanisms along a length direction of the support mechanisms.

13. The exposure device of claim 12, wherein the support mechanism adsorbing plates are displaced in the third direction in accordance with the detection of the detecting means.

* * * * *